United States Patent
Matsuzawa et al.

[11] Patent Number: 5,831,770
[45] Date of Patent: Nov. 3, 1998

[54] PROJECTION OPTICAL SYSTEM AND EXPOSURE APPARATUS PROVIDED THEREWITH

[75] Inventors: Hitoshi Matsuzawa, Setagaya-ku; Yutaka Suenaga, Yokohama, both of Japan

[73] Assignee: Nikon Corporation, Japan

[21] Appl. No.: 826,062

[22] Filed: Mar. 24, 1997

Related U.S. Application Data

[63] Continuation of Ser. No. 559,395, Nov. 15, 1995, abandoned.

[30] Foreign Application Priority Data

Oct. 12, 1995 [JP] Japan ................................ 7-263932

[51] Int. Cl.$^6$ ................................ G02B 3/00; G02B 21/02; G02B 9/62; G03B 27/54
[52] U.S. Cl. ................................ 359/649; 359/658; 359/740; 359/757; 355/53; 355/67
[58] Field of Search ................................ 359/656, 657, 359/658, 649, 740, 756, 757, 650, 651, 679, 675; 355/53, 67

[56] References Cited

U.S. PATENT DOCUMENTS

| | | | |
|---|---|---|---|
| 3,391,974 | 7/1968 | Ride et al. | 359/656 |
| 3,737,215 | 6/1973 | De Jager | 359/760 |
| 3,909,115 | 9/1975 | Kano | 359/754 |
| 4,080,048 | 3/1978 | Kimura | 359/750 |
| 4,666,273 | 5/1987 | Shimizu et al. | 353/101 |
| 4,770,477 | 9/1988 | Shafer | 359/355 |
| 4,772,107 | 9/1988 | Friedman | 359/754 |
| 4,811,055 | 3/1989 | Hirose | 355/53 |
| 4,891,663 | 1/1990 | Hirose | 355/53 |
| 4,977,426 | 12/1990 | Hirose | 355/53 |
| 5,097,291 | 3/1992 | Suzuki | 355/69 |
| 5,105,075 | 4/1992 | Ohta et al. | 250/201.2 |
| 5,132,845 | 7/1992 | Suzuki | 359/656 |
| 5,159,496 | 10/1992 | Kataoka | 359/754 |
| 5,194,893 | 3/1993 | Nishi | 355/53 |
| 5,245,384 | 9/1993 | Mori | 355/67 |
| 5,260,832 | 11/1993 | Togino et al. | 359/679 |
| 5,493,402 | 2/1996 | Hirukawa | 356/400 |
| 5,506,684 | 4/1996 | Ota et al. | 356/401 |
| 5,517,360 | 5/1996 | Suzuki | 359/656 |
| 5,534,970 | 7/1996 | Nakashima et al. | 355/53 |

FOREIGN PATENT DOCUMENTS

| | | |
|---|---|---|
| 63-118115 (A) | 5/1988 | Japan . |
| 4-157412 (A) | 5/1992 | Japan . |
| 7-140384 | 6/1995 | Japan . |
| 7-140385 | 6/1995 | Japan . |
| WO 93/04391 | 3/1993 | WIPO . |

Primary Examiner—Georgia Y. Epps
Assistant Examiner—Evelyn A. Lester
Attorney, Agent, or Firm—Pennie & Edmonds LLP

[57] ABSTRACT

This invention is directed to a bitelecentric projection optical system very well corrected for various distortions, particularly for distortion (including higher-order distortions) as securing a relatively wide exposure area and a large numerical aperture. The projection optical system according to this invention comprises in order from the object side toward the image side a first lens group having a positive refractive power, a second lens group having a negative refractive power and not including a positive lens, a third lens group having a positive refractive power, a fourth lens group having a negative refractive power, a fifth lens group having a positive refractive power, and a sixth lens group having a positive refractive power. Particularly, the second lens group comprises a front lens disposed nearest to the object, a rear lens disposed nearest to the image, and an intermediate lens group disposed between the front lens and the rear lens and having at least two negative lenses, and the fifth lens group has at least seven positive lenses.

79 Claims, 9 Drawing Sheets

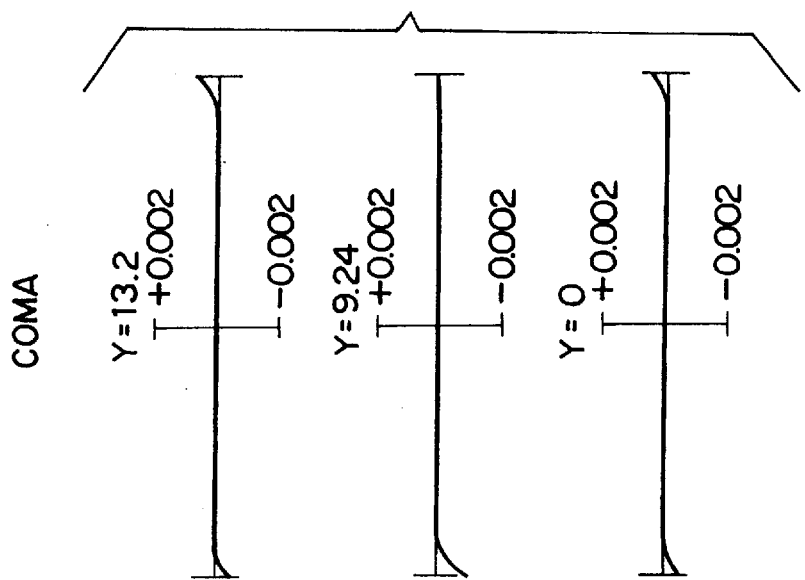
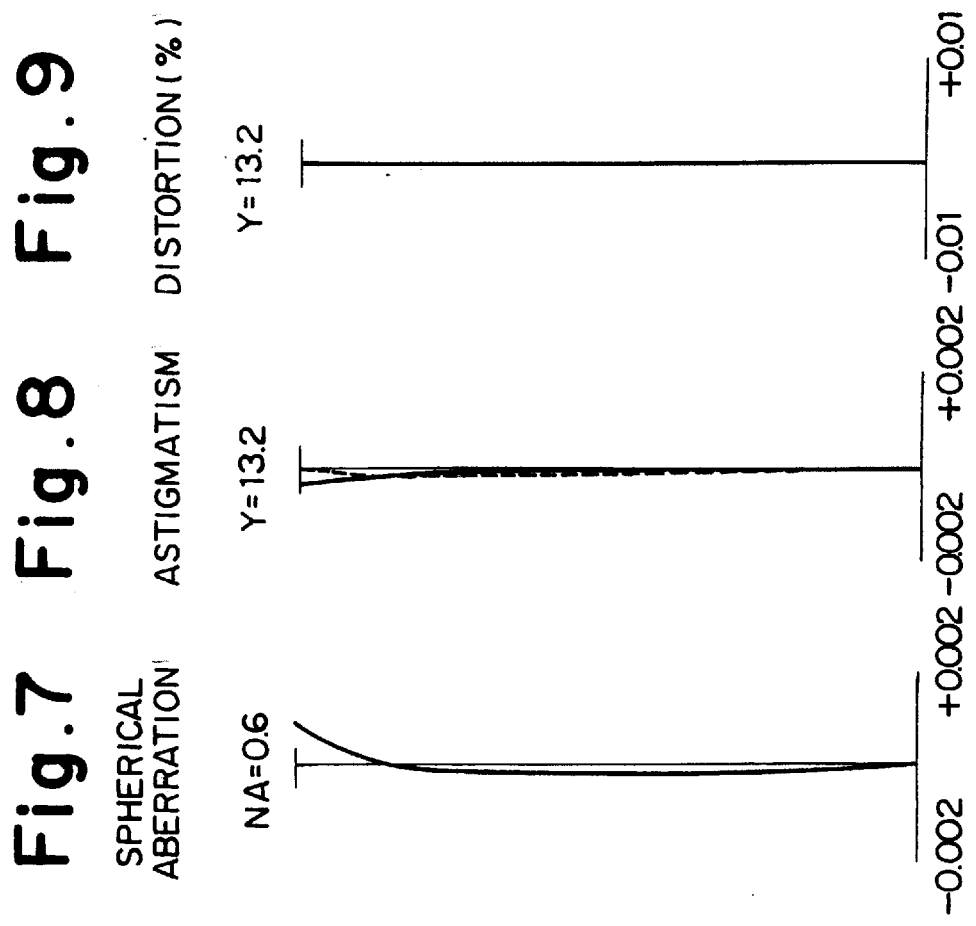

SPHERICAL ABERRATION　ASTIGMATISM　DISTORTION (%)

NA=0.6　Y=13.2　Y=13.2

COMA

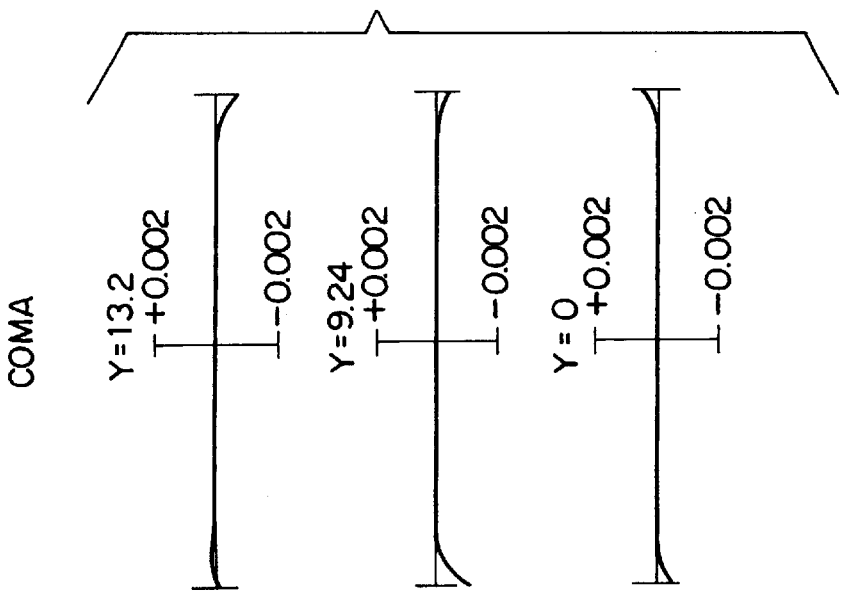
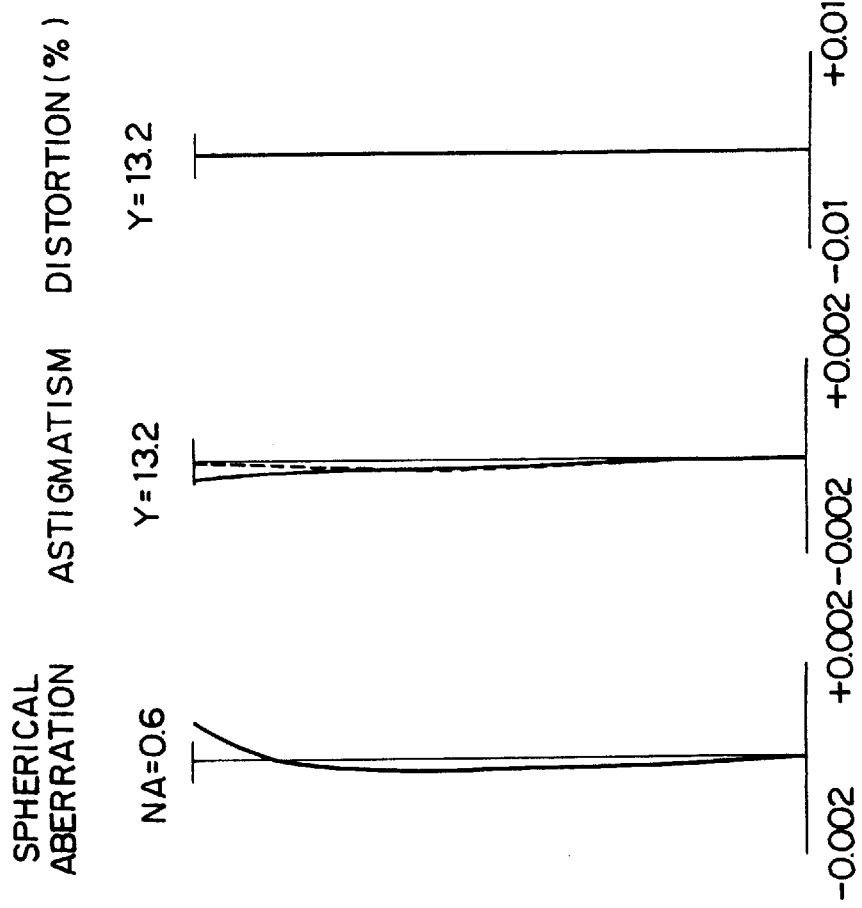

PROJECTION OPTICAL SYSTEM AND EXPOSURE APPARATUS PROVIDED THEREWITH

This is a continuation of application Ser. No. 08/559,395, filed Nov. 15, 1995, now abandoned.

BACKGROUND OF THE INVENTION

1. Field of the Invention

The present invention relates to a projection optical system for projecting a pattern on a first object onto a substrate or the like as a second object. More particularly, the invention concerns a projection optical system suitably applicable for projection-exposing a pattern for semiconductor or for liquid crystal formed on a reticle (or mask) as a first object onto a substrate (silicon wafer, glass plate, etc.) as a second object.

2. Related Background Art

As patterns of integrated circuits become finer and finer, higher performance is being demanded for the projection optical system used for printing onto the wafer. Under such circumstances, resolving power of projection optical system can be conceivably improved by using shorter exposure wavelength $\lambda$ or increasing the numerical aperture (NA) of projection optical system.

In order to meet the demands to make transfer patterns finer, a light source for exposure is changing recently from one for emitting light of exposure wavelength of the g-line (436 nm) to one for emitting light of exposure wavelength of the i-line (365 nm), which is mainly used these years. Further, light sources for emitting light of further shorter wavelengths, for example excimer lasers (248 nm, 193 nm), are being used as a light source for exposure.

There are proposed projection optical systems for projection-printing patterns on the reticle onto the wafer with light of the above various exposure wavelengths.

The projection optical systems are demanded to decrease image distortion as well as to improve the resolving power. Here, the image distortion is caused by distortion due to the projection optical system, warpage of the wafer to be printed on the image side of projection optical system, warpage of the reticle with circuit patterns etc. written thereon on the object side of projection optical system, etc.

Recent further progress in micronizing the transfer patterns is making stronger the demand to decrease the image distortion.

In order to decrease influence of the wafer warpage on the image distortion, a so-called image-side telecentric optical system has been used heretofore, which locates the image-side exit pupil of projection optical system far away from the image plane (on the wafer).

On the other hand, in order to decrease the image distortion due to the reticle warpage, it is considered to use a so-called object-side telecentric optical system, which locates the entrance-pupil of projection optical system far away from the object plane (on the reticle). The prior art for locating the entrance pupil of projection optical system relatively far away from the object plane is disclosed, for example, in Japanese Laid-open Patent Applications No. 63-118115, No. 4-157412, and No. 5-173065.

SUMMARY OF THE INVENTION

A projection optical system according to the present invention is a so-called bitelecentric projection optical system, which is telecentric both on the object side and on the image side. An object of the invention is to provide a projection optical system which can greatly improve aberrations, particularly distortion (including higher-order distortions) while securing a relatively wide exposure area and a large numerical aperture (NA).

The projection optical system according to the present invention can be applied to either of exposure apparatus utilizing a scanning exposure method and exposure apparatus utilizing a one-shot exposure method. An exposure apparatus to which the projection optical system of the present invention is applied, comprises, at least, a first stage (wafer stage WS) capable of holding a photosensitive substrate on a main surface thereof, an illumination optical system IS for transferring a predetermined pattern on said mask onto a substrate, and a second stage (reticle stage RS) for holding the mask, and the projection optical system PL of the present invention is arranged between the mask (first object) and the substrate (second object) to project an image of the mask onto the substrate (see FIG. 2).

The projection optical system according to the present invention comprises, for example as shown in FIG. 1, a first lens group $G_1$ having a positive refractive power, a second lens group $G_2$ having a negative refractive power, a third lens group $G_3$ having a positive refractive power, a fourth lens group $G_4$ having a negative refractive power, a fifth lens group $G_5$ having a positive refractive power, and a sixth lens group $G_6$ having a positive refractive power, arranged in the stated order from the mask (first object) to the substrate (second object).

Particularly, the second lens group $G_2$ does not include any positive lens, and the second lens group $G_2$ comprises a front lens $L_{2F}$ with a negative refractive power, arranged nearest to the mask and having a concave surface directed to the substrate side, a rear lens $L_{2R}$ with a negative refractive power, arranged nearest to the substrate and having a concave surface directed to the mask side, and an intermediate lens group $G_{2m}$ having at least two negative lenses, disposed between the front lens $L_{2F}$ and the rear lens $L_{2R}$. The above fifth lens group $G_5$ comprises at least seven positive lenses.

The first lens group $G_1$ having the positive refractive power contributes mainly to correction for distortion while maintaining telecentricity. Specifically, the first lens group $G_1$ generates a positive distortion, which corrects in a good balance a negative distortion caused by the plurality of lens groups located on the second object side of the first lens group $G_1$. The second lens group $G_2$ having the negative refractive power and the fourth lens group $G_4$ having the negative refractive power contribute mainly to correction for Petzval sum in order to flatten the image plane. The second lens group $G_2$ having the negative refractive power and the third lens group $G_3$ having the positive refractive power compose an inverted telescopic system. This inverted telescopic system contributes to securing the back focus (which is a distance from an optical surface, for example a lens surface, nearest to the second object in the projection optical system to the second object) of the projection optical system. The fifth lens group $G_5$ having the positive refractive power and the sixth lens group $G_6$ similarly having the positive refractive power contribute to suppressing generation of distortion. Particularly, these lens groups $G_5$, $G_6$ contribute to suppressing occurrence of spherical aberration as much as possible in order to get ready well for higher NA on the second object side.

Based on the above setup, the front lens $L_{2F}$ arranged nearest to the first object in the second lens group $G_2$, having the concave surface directed to the second object side, and having the negative refractive power, and the rear lens $L_{2R}$ arranged nearest to the second object in the second lens group $G_2$, having the concave surface directed to the first object, and having the negative refractive power both contribute to correction for curvature of field and coma.

Further, the intermediate lens group $G_{2m}$ disposed between the front lens $L_{2F}$ and the rear lens $L_{2R}$ and having the negative refractive power greatly contributes to correction for curvature of field. Further, the intermediate lens group $G_{2m}$ is composed of only negative lenses. The setup of the entire second lens group $G_2$ composed of only negative lenses shortens the total length of the projection optical system while well suppressing occurrence of higher-order distortions, which are likely to occur in the intermediate lens group. Further, the intermediate lens group $G_{2m}$ includes at least two negative lenses. This setup contributes to fully suppressing occurrence of coma.

Further, the fifth lens group $G_5$ includes at least seven positive lenses. This setup allocates the refractive power to be born by the fifth lens group itself to the respective positive lenses in a good balance. Thus, negative spherical aberration, which is likely to occur in the fifth lens group $G_5$ with an increase in numerical aperture (NA), can be well suppressed. Accordingly, this setup (where the fifth lens group $G_5$ includes at least seven positive lenses) assures high resolving power of projection optical system.

The projection optical system according to the present invention satisfies the following conditions, when the focal length of the first lens group $G_1$ is $f_1$, the focal length of the second lens group $G_2$ is $f_2$, the focal length of the third lens group $G_3$ is $f_3$, the focal length of the fourth lens group $G_4$ is $f_4$, the focal length of the fifth lens group $G_5$ is $f_5$, the focal length of the sixth lens group $G_6$ is $f_6$, the composite focal length of the intermediate lens group $G_{2m}$ in the second lens group $G_2$ is $f_{2m}$, and a distance between the object plane $P_1$ on the mask and the image plane $P_2$ on the substrate is L.

$$0.1 < f_1/f_3 < 17 \quad (1)$$

$$0.05 < f_2/f_4 < 7 \quad (2)$$

$$0.01 < f_5/L < 0.9 \quad (3)$$

$$0.02 < f_6/L < 1.6 \quad (4)$$

$$1.1 < f_{2m}/f_2 < 9 \quad (5)$$

Condition (1) defines an optimum ratio of the focal length $f_1$ of the first lens group $G_1$ of the positive refractive power and the focal length $f_3$ of the third lens group $G_3$ of the positive refractive power, which is an optimal refractive power balance (power balance) between the first lens group $G_1$ and the third lens group $G_3$. This condition (1) is a condition for mainly achieving well-balanced correction for distortion. Accordingly, if the ratio were set below the lower limit of condition (1), great negative distortion would appear, because the refractive power of the third lens group $G_3$ becomes relatively weaker than the refractive power of the first lens group $G_1$. If the ratio were set above the upper limit of condition (1), great negative distortion would appear, because the refractive power of the first lens group becomes relatively weaker than the refractive power of the third lens group.

Condition (2) defines an optimum ratio of the focal length $f_2$ of the second lens group $G_2$ of the negative refractive power and the focal length $f_4$ of the fourth lens group $G_4$ of the negative refractive power, which is an optimal refractive power balance (power balance) between the second lens group $G_2$ of the negative refractive power composed of only the plurality of negative lenses and the fourth lens group $G_4$ of the negative refractive power. This condition (2) is a condition for mainly achieving good correction for curvature of field while securing a wide exposure field as keeping Petzval sum small. Accordingly, if the ratio were set below the lower limit of this condition (2), great positive Petzval sum would occur because the refractive power of the fourth lens group $G_4$ becomes relatively weaker than that of the second lens group $G_2$. If the ratio were set above the upper limit of condition (2), great positive Petzval sum would occur because the refractive power of the second lens group $G_2$ becomes relatively weaker than that of the fourth lens group $G_4$. In order to achieve better-balanced correction for Petzval sum under a wide exposure field by making the refractive power of the fourth lens group $G_4$ relatively stronger than that of the second lens group $G_2$, it is preferred to set the lower limit of the above condition (2) to 0.4 so as to be $0.4 < f_2/f_4$.

Condition (3) defines an optimum ratio of the focal length $f_5$ of the fifth lens group $G_5$ of the positive refractive power to the distance (object-image distance) L from the object plane P1 of the first object (reticle or the like) to the image plane P2 of the second object (wafer or the like). This condition (3) is a condition for achieving well-balanced correction for spherical aberration, distortion, and Petzval sum while maintaining a large numerical aperture. Accordingly, if the ratio were set below the lower limit of this condition (3), the refractive power of the fifth lens group $G_5$ would become too strong, so that the fifth lens group $G_5$ gives rise to great negative spherical aberration as well as negative distortion. In order to fully suppress negative spherical aberration, which is likely to occur in the fifth lens group $G_5$, it is preferred to set the lower limit of above condition (3) to 0.081 so as to be $0.081 < f_5/L$. Conversely, if the ratio were set above the upper limit of this condition (3), the refractive power of the fifth lens group $G_5$ would become too weak, and with it the refractive power of the fourth lens group $G_4$ with the negative refractive power would naturally become weak. As a result, it would become impossible to correct Petzval sum well.

Condition (4) defines an optimum ratio of the focal length $f_6$ of the sixth lens group $G_6$ of the positive refractive power to the distance (object-image distance) L from the object plane P1 of the first object (reticle or the like) to the image plane P2 of the second object (wafer or the like). This condition (4) is a condition for suppressing occurrence of higher-order spherical aberrations and negative distortion while maintaining a large numerical aperture. Accordingly, if the ratio were set below the lower limit of this condition (4), the sixth lens group itself would give rise to great negative distortion. On the other hand, if the ratio were set above the upper limit of this condition (4), higher-order spherical aberrations would occur.

Condition (5) defines an optimum ratio of the composite focal length $f_{2m}$ of the intermediate lens group $G_{2m}$ having the negative refractive power in the second lens group $G_2$ and the focal length $f_2$ of the second lens group $G_2$.

This condition (5) is a condition for keeping Petzval sum small while suppressing occurrence of distortion. Accordingly, if the ratio were set below the lower limit of this condition (5), the negative composite refractive power of the intermediate lens group $G_{2m}$ in the second lens group $G_2$ would become too strong, so that great negative distortion would occur. In order to fully suppress occurrence of distortion and coma, it is preferred to set the lower limit of above condition (5) to 1.86 so as to be $1.86 < f_{2m}/f_2$.

On the other hand, if the ratio were set above the upper limit of this condition (5), the negative refractive power of the intermediate lens group $G_{2m}$ in the second lens group $G_2$ would become too weak, so that great positive Petzval sum would result. In addition, the refractive power of the third lens group $G_3$ also would become weak, which makes compactification of projection optical system difficult. In order to achieve sufficient compactification of projection optical system while well correcting for Petzval sum, it is preferred to set the upper limit of above condition (5) to 2.9 so as to be $f_{2m}/f_2<2.9$.

Further, the projection optical system is preferably arranged to satisfy the following condition (6) when an axial distance from the first object to the first object side focal point of the overall projection optical system is I and the distance from the first object to the second object is L.

$$1.0<I/L \tag{6}$$

Condition (6) defines an optimum ratio of the axial distance I from the first object to the first object side focal point of the overall projection optical system to the distance (object-image distance) L from the object plane P1 of the first object (reticle or the like) to the image plane P2 of the second object (wafer or the like). Here, the first object side focal point of the overall projection optical system means an intersecting point of light emerging from the projection optical system with the optical axis thereof when parallel light in the paraxial region relative to the optical axis of the projection optical system is made to enter the projection optical system from the second object side thereof and the light in the paraxial region emerges from the projection optical system (see FIG. 1).

If the ratio were set below the lower limit of this condition (6), telecentricity would be heavily destroyed on the first object side of projection optical system, which would increase a change of magnification and a change of distortion due to deviation of the first object in the axial direction. As a result, it would become difficult to project a faithful image of the first object onto the second object at a desired magnification. In order to suppress more sufficiently the change of magnification and change of distortion due to deviation of the first object in the axial direction, it is preferred to set the lower limit of above condition (6) to 1.7 so as to be $1.7<I/L$. Further, in order to achieve well-balanced correction for spherical aberration and distortion of pupil while maintaining compactification of projection optical system, it is preferred to set the upper limit of above condition (6) to 6.8 so as to be $I/L<6.8$.

Next, in order to mainly correct for third-order spherical aberration well, the fifth lens group $G_5$ having the positive refractive power is provided, as shown in FIG. 1, with a negative meniscus lens $L_{55}$, and a first positive lens $L_{54}$ disposed adjacent to a concave surface of the negative meniscus lens $L_{55}$ and having a convex surface opposed to the concave surface of the negative meniscus lens $L_{55}$. In addition, the fifth lens group $G_5$ is arranged more preferably to satisfy the following condition (7) when $r_{5n}$ is a radius of curvature of the concave surface of the negative meniscus lens $L_{55}$ in the fifth lens group $G_5$ and $r_{5p}$ is a radius of curvature of the convex surface of the first positive lens $L_{54}$, opposed to the concave surface of the negative meniscus lens $L_{55}$.

$$0<(r_{5p}-r_{5n})/(r_{5p}+r_{5n})<1 \tag{7}$$

If the ratio were set below the lower limit of condition (7), correction would become under for third-order spherical aberration, which is thus not preferred. On the other hand, if the ratio were set above the upper limit of condition (7), correction would become over for third-order spherical aberration, which is thus not preferred. Here, in order to achieve better correction for third-order spherical aberration, it is more preferred to set the lower limit of condition (7) to 0.01 so as to be $0.01<(r_{5p}-r_{5n})/(r_{5p}+r_{5n})$. In addition, it is further preferred to set the upper limit of condition (7) to 0.7 so as to be $(r_{5p}-r_{5n})/(r_{5p}+r_{5n})<0.7$.

Here, it is preferred that the fifth lens group $G_5$ have at least one positive lens on the convex surface side of the negative meniscus lens $L_{55}$ disposed adjacent to the above first positive lens $L_{54}$ and at least one positive lens on the opposite side to the negative meniscus lens $L_{55}$, with respect to the above first positive lens $L_{54}$ disposed adjacent to the negative meniscus lens $L_{55}$. These positive lenses correspond to, for example in the case of the lens setup of FIG. 1, the lens $L_{53}$ (second positive lens) and lens $L_{56}$ (third positive lens). This setup can suppress occurrence of higher-order spherical aberrations, which are likely to occur with an increase in NA.

The sixth lens group $G_6$ is arranged more preferably to satisfy the following condition (8) when $r_{6F}$ is a radius of curvature of a lens surface nearest to the first object in the sixth lens group $G_6$ and $d_6$ is an axial distance from the lens surface nearest to the first object in the sixth lens group $G_6$ to the second object (see FIG. 1).

$$0.50<d_6/r_{6F}<1.50 \tag{8}$$

If the ratio were set above the upper limit of this condition (8), the positive refractive power of the lens surface nearest to the first object in the sixth lens group $G_6$ would become too strong, thereby causing great negative distortion and coma. If the ratio were set below the lower limit of this condition (8), the positive refractive power of the lens surface nearest to the first object in the sixth lens group $G_6$ would become too weak, thereby causing great coma. In order to suppress occurrence of coma more, it is desired to set the lower limit of condition (8) to 0.84 so as to be $0.84<d_6/r_{6F}$.

The fifth lens group $G_5$ is desirably arranged to have a negative lens $L_{59}$ with a concave surface directed to the second object side, located nearest to the second object. Since this setup causes the negative lens $L_{59}$ located nearest to the second object in the fifth lens group $G_5$ to generate positive distortion and negative Petzval sum, they can cancel negative distortion and positive Petzval sum caused by the positive lenses in the fifth lens group $G_5$. In this case, the fifth lens group $G_5$ is arranged more desirably to satisfy the following condition (9) when $r_{5F}$ is a radius of curvature of a first object side lens surface in the negative lens $L_{59}$ located nearest to the second object in the fifth lens group $G_5$ and $r_{5R}$ is a radius of curvature of the second object side lens surface in the negative lens $L_{59}$ located nearest to the second object in the fifth lens group $G_5$.

$$0.30<(r_{5F}-r_{5R})/(r_{5F}+r_{5R})<1.28 \tag{9}$$

If the ratio were set below the lower limit of this condition (9), it would become difficult to correct for both Petzval sum and coma. On the other hand, if the ratio were set above the upper limit of this condition (9), great higher-order comas would occur, which is thus not preferred. In order to further prevent occurrence of higher-order comas, it is preferred to set the upper limit of condition (9) to 0.93 so as to be $(r_{5F}-r_{5R})/(r_{5F}+r_{5R})<0.93$.

The fifth lens group $G_5$ is provided with a first positive meniscus lens $L_{51}$ disposed nearest to the first object and having a convex surface directed to the second object side, and a second positive meniscus lens $L_{52}$ disposed on the second object side of the first positive meniscus lens $L_{51}$ and having a convex surface directed to the second object side. In addition, the fifth lens group $G_5$ is more preferably arranged to satisfy the following condition when $r_{51F}$ is a radius of curvature of a first object side lens surface in the first positive meniscus lens $L_{51}$ in the fifth lens group $G_5$, $r_{51R}$ is a radius of curvature of the second object side lens surface in the first positive meniscus lens $L_{51}$ in the fifth lens group $G_5$, $r_{52F}$ is a radius of curvature of a first object side lens surface in the second positive meniscus lens $L_{52}$ in the fifth lens group $G_5$, and $r_{52R}$ is a radius of curvature of the second object side lens surface in the second positive meniscus lens $L_{52}$ in the fifth lens group $G_5$.

$$1.2 < Q_{52}/Q_{51} < 8 \tag{10}$$

In the above equation, $$Q_{51} = (r_{51F} - r_{51R})/(r_{51F} + r_{51R})$$

$$Q_{52} = (r_{52F} - r_{52R})/(r_{52F} + r_{52R}).$$

If the ratio of shape factors of this condition (10) were set above the upper limit thereof or below the lower limit thereof, it would become difficult to correct for spherical aberration and coma occurring in the fifth lens group $G_5$. As a result, it would become impossible to realize excellent imaging performance. In order to achieve better-balanced correction for spherical aberration, it is preferred to set the lower limit of condition (10) to 3.3 so as to be $3.3 < Q_{25}/Q_{51}$.

Further, the fifth lens group $G_5$ is arranged much more preferably to satisfy the following condition when $r_{51F}$ is the radius of curvature of the first object side lens surface in the first positive meniscus lens $L_{51}$ in the fifth lens group $G_5$ and $r_{51R}$ is the radius of curvature of the second object side lens surface in the first positive meniscus lens $L_{51}$ in the fifth lens group $G_5$.

$$0.01 < Q_{51} < 0.8 \tag{11}$$

In the above equation, $Q_{51} = (r_{51F} - r_{51R})/(r_{51F} + r_{51R})$.

If the shape factor $Q_{51}$ in this condition (10) were set above the upper limit thereof or below the lower limit thereof, it would unpreferably become difficult to fully correct for spherical aberration occurring in the fifth lens group $G_5$. In order to correct for spherical aberration more sufficiently, it is preferred to set the lower limit of condition (11) to 0.09 so as to be $0.09 < Q_{51}$. Further, in order to achieve much better-balanced correction for coma, it is preferred to set the upper limit of condition (11) to 0.25 so as to be $Q_{51} < 0.25$.

The front lens $L_{2F}$ and rear lens $L_{2R}$ in the second lens group $G_2$ preferably satisfy the following condition when $f_{2F}$ is the focal length of the front lens $L_{2F}$ and $f_{2R}$ is the focal length of the rear lens $L_{2R}$.

$$0 \leq f_{2F}/f_{2R} < 18 \tag{12}$$

Condition (12) defines an optimum ratio of the focal length $f_{2R}$ of the rear lens $L_{2R}$ in the second lens group $G_2$ and the focal length $f_{2F}$ of the front lens $L_{2F}$ in the second lens group $G_2$. If the ratio of this condition (12) were set above the upper limit thereof or below the lower limit thereof, the balance of refractive power of the first lens group $G_1$ or the third lens group $G_3$ would be destroyed. As a result, it would become difficult to achieve good correction for distortion or simultaneous good correction for Petzval sum and astigmatism.

In order to make the above lens groups function to achieve sufficient aberration correction, the following specific arrangements are desired to be employed.

First, in order that the first lens group $G_1$ is made to have a function to suppress occurrence of higher-order distortions and spherical aberration of pupil, the first lens group $G_1$ is preferably arranged to have at least two positive lenses. In order that the third lens group $G_3$ is made to have a function to suppress degradation of spherical aberration and Petzval sum, the third lens group $G_3$ is preferably arranged to have at least three positive lenses. In order that the fourth lens group $G_4$ is made to have a function to suppress occurrence of coma while correcting for Petzval sum, the fourth lens group $G_4$ is preferably arranged to have at least three negative lenses. In order that the fifth lens group $G_5$ is made to have a function to suppress occurrence of spherical aberration, the fifth lens group $G_5$ is preferably arranged to have at least seven positive lenses. In addition, in order that the fifth lens group $G_5$ is made to have a function to correct for negative distortion and Petzval sum, the fifth lens group $G_5$ is preferably arranged to have at least one negative lens. In order that the sixth lens group $G_6$ is made to condense the light on the second surface while not giving rise to great spherical aberration, the sixth lens group $G_6$ is preferably arranged to have at least one positive lens.

In order that the sixth lens group $G_6$ is made to have a function to further suppress occurrence of negative distortion, the sixth lens group $G_6$ is preferably arranged to be composed of three or less lenses having at least one lens surface to satisfy the following condition (13). In other words, it is preferred that the lenses constituting the sixth lens group $G_6$ have at least one lens surface to satisfy the following condition.

$$1/|\Phi L| < 20 \tag{13}$$

In the above equation, $\Phi$: a refractive power of the lens surface,

L: the object-image distance from the first object to the second object.

The refractive power of the lens surface stated herein is defined by the following equation when r is a radius of curvature of the lens surface, $n_1$ is a refractive index of a first-object-side medium of the lens surface, and $n_2$ is a refractive index of a second-object-side medium of the lens surface.

$$\Phi = (n_2 - n_1)/r$$

Here, if four or more lenses have lens surfaces satisfying this condition (13), new occurrence of distortion would result by an increase of the number of lens surfaces having some curvature as disposed near the second object, which is not preferred.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

BRIEF DESCRIPTION OF THE DRAWINGS

FIGS. 7 to 10 are drawings to show various aberrations in the first embodiment shown in FIG. 3;

FIGS. 15 to 18 are drawings to show various aberrations in the third embodiment shown in FIG. 5.

DETAILED DESCRIPTION OF THE PREFERRED EMBODIMENTS

Figure 1:
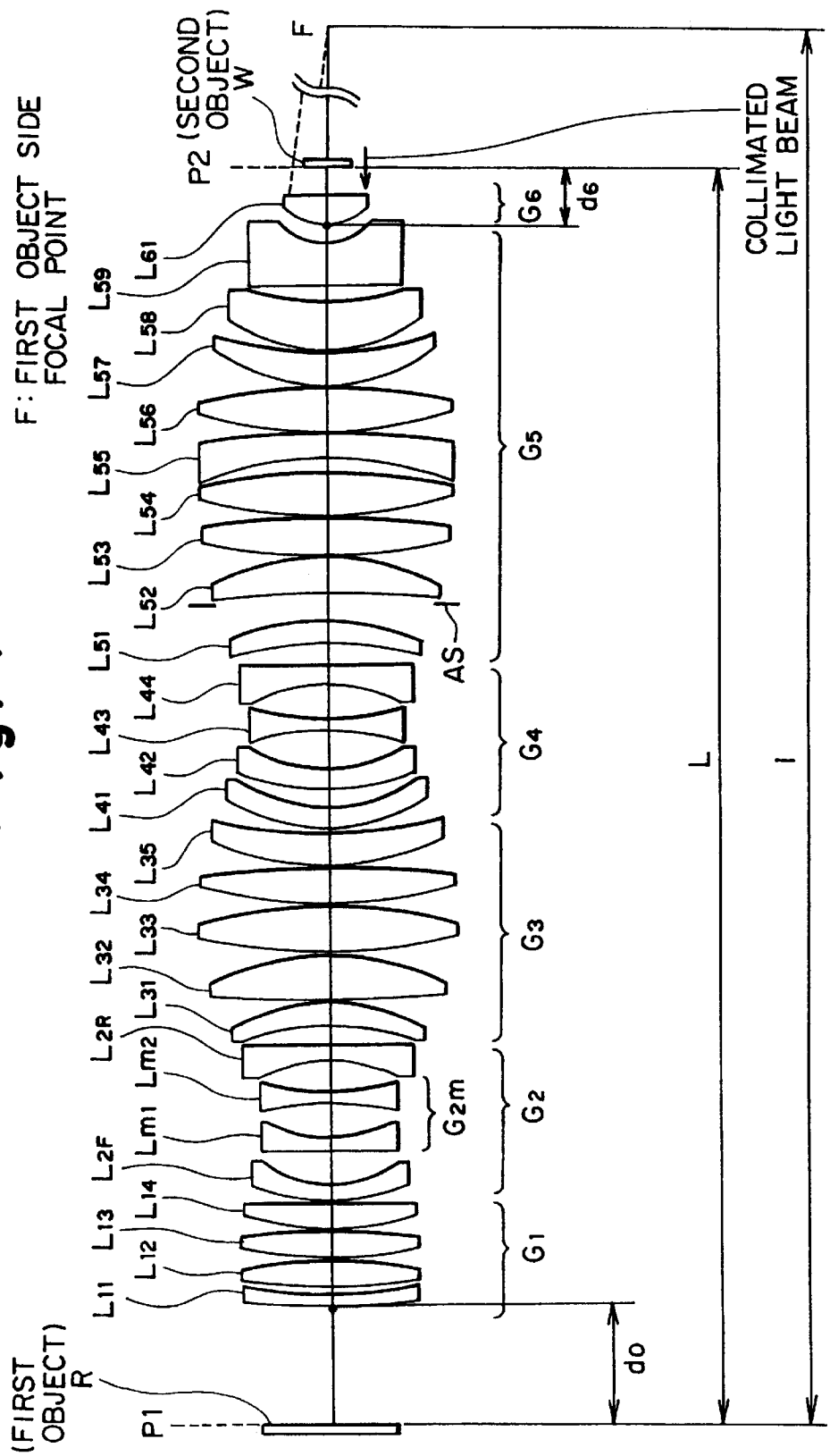
FIG. 1 is a drawing to illustrate common parts to lens layouts of the projection optical system according to the present invention.

The projection optical system according to the present invention will be explained referring to FIG. 2 to FIG. 19. FIG. 1 will be made reference to when necessary.

Figure 2:
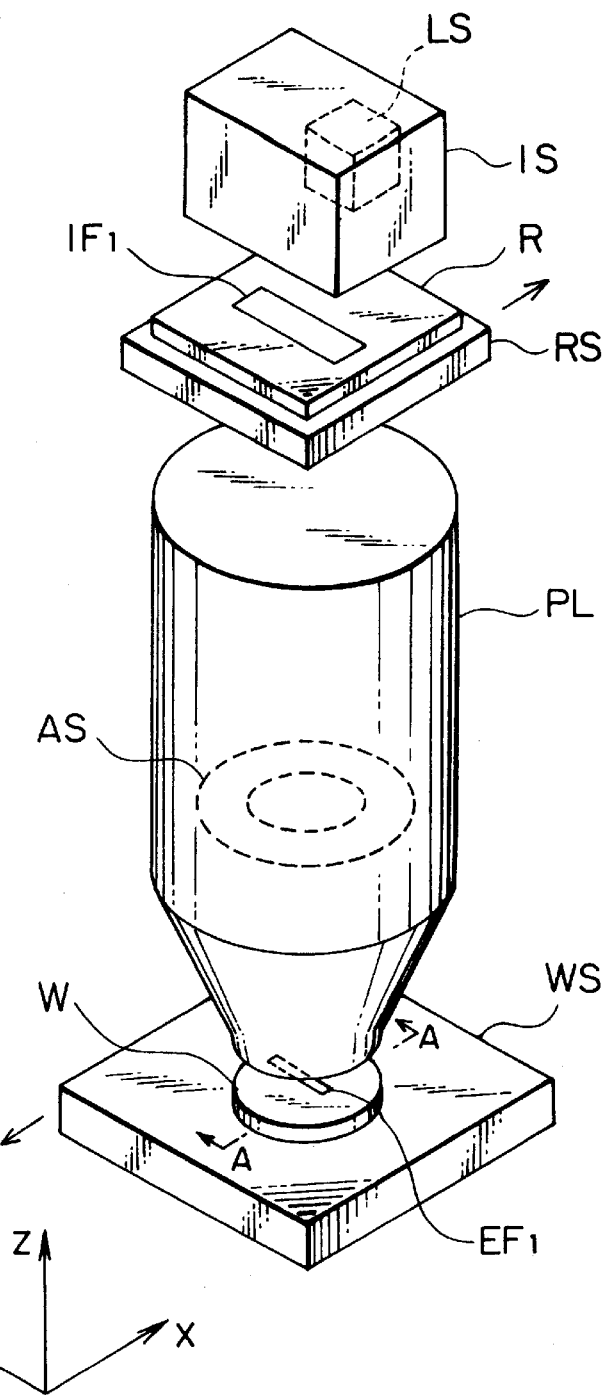
FIG. 2 is a drawing to show the schematic setup of a scanning exposure apparatus to which the projection optical system according to the present invention can be applied.

FIG. 2 is a drawing to show the schematic setup of a scanning exposure apparatus to which the projection optical system according to the present invention can be applied.

FIG. 2 will be explained briefly. In the exposure apparatus shown in FIG. 2, the reticle R (first object) as a photomask in which predetermined circuit patterns are formed is disposed on the object plane P1 of the projection optical system PL, and the wafer W (second object) as a photosensitive substrate is disposed on the image plane P2 of the projection optical system PL. The reticle R is held on a reticle stage RS arranged to move in the X-direction upon exposure, and the wafer W is held on a wafer stage WS arranged to move in the X-direction opposite to movement of the reticle stage RS. As shown in FIG. 2, a slit (rectangular) illumination area $IF_1$ extending in the Y-direction is formed on the reticle R, and an illumination optical system IS for uniformly illuminating the illumination area $IF_1$ is disposed above the reticle R. Exposure light is emitted from a light source LS provided in the illumination system.

In the above arrangement, the light supplied from the light source LS in the illumination optical system IS illuminates the reticle R in a slit pattern. An image of the light source LS in the illumination optical system IS is formed at the position of the pupil (the position of aperture stop AS) of the projection optical system PL, thus realizing so-called Köhler illumination. Then an image of the pattern of reticle R Köhler-illuminated is projected (or transferred) onto the wafer W through the projection optical system PL.

Figure 3:
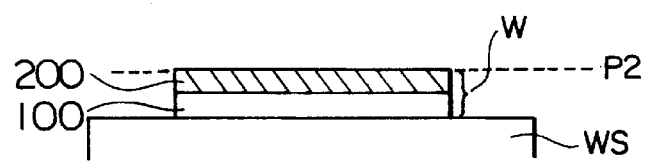
FIG. 3 is a drawing to show the sectional structure of a photosensitive substrate.

The photosensitive substrate placed on the above wafer stage WS is one obtained by coating the entire surface of exposed object 100 such as a silicon wafer, a glass plate, or the like with a photosensitive material 200 such as a photoresist, as shown in FIG. 3.

On this occasion, an area $EF_1$ of the pattern image of reticle R exposed on the wafer W is a slit pattern (rectangular shape) extending in the Y-direction, as shown in FIG. 2. Thus, when the projection magnification factor of the projection optical system PL is 1/M, the reticle stage RS and wafer stage WS are moved in mutually opposite directions along the X-direction in the velocity ratio of M:1, whereby the pattern image of the entire surface of reticle R is transferred onto the wafer W.

The art related to various exposure apparatus as described above is disclosed, for example, in U.S. patent application Ser. No. 08/255,927, Ser. No. 08/260,398, and Ser. No. 08/299,305, and U.S. Pat. No. 4,497,015, U.S. Pat. No. 4,666,273, U.S. Pat. No. 5,194,893, U.S. Pat. No. 5,253,110, U.S. Pat. No. 5,333,035, and U.S. Pat. No. 5,379,091. The projection optical system according to the present invention can be applied to any exposure apparatus disclosed in the listed references.

The above U.S. patent application Ser. No. 08/255,927 describes the illumination optical system (using a laser light source) applicable to the scanning exposure apparatus. The above U.S. patent application Ser. No. 08/260,398 describes the illumination optical system (using a lamp light source) applicable to the scanning exposure apparatus. The U.S. patent application Ser. No. 08/299,305 discloses an alignment mechanism applicable to the scanning exposure apparatus. The U.S. Pat. No. 4,497,015 describes the illumination optical system (using a lamp light source) applicable to popular exposure apparatus. The U.S. Pat. No. 4,666,273 discloses an example of the step-and-repeat type exposure apparatus. The U.S. Pat. No. 5,194,893 discloses the scanning exposure apparatus, particularly, the illumination optical system, illumination area, mask-side and reticle-side interference systems, automatic focusing mechanism, and alignment optical system. The U.S. Pat. No. 5,253,110 describes the illumination optical system (using a laser light source) applicable to the step-and-repeat type exposure apparatus. However, the illumination optical system disclosed in this reference can also be applied to the scanning exposure apparatus. The U.S. Pat. No. 5,333,035 discloses a modified illumination optical system applicable to popular exposure apparatus. The U.S. Pat. No. 5,379,091 discloses the illumination optical system (using a laser light source) applicable to the scanning exposure apparatus. In addition, U.S. Pat. No. 5,245,384 also shows the illumination optical system using a mercury lamp, applicable to ordinary exposure apparatus (steppers).

Figure 4:
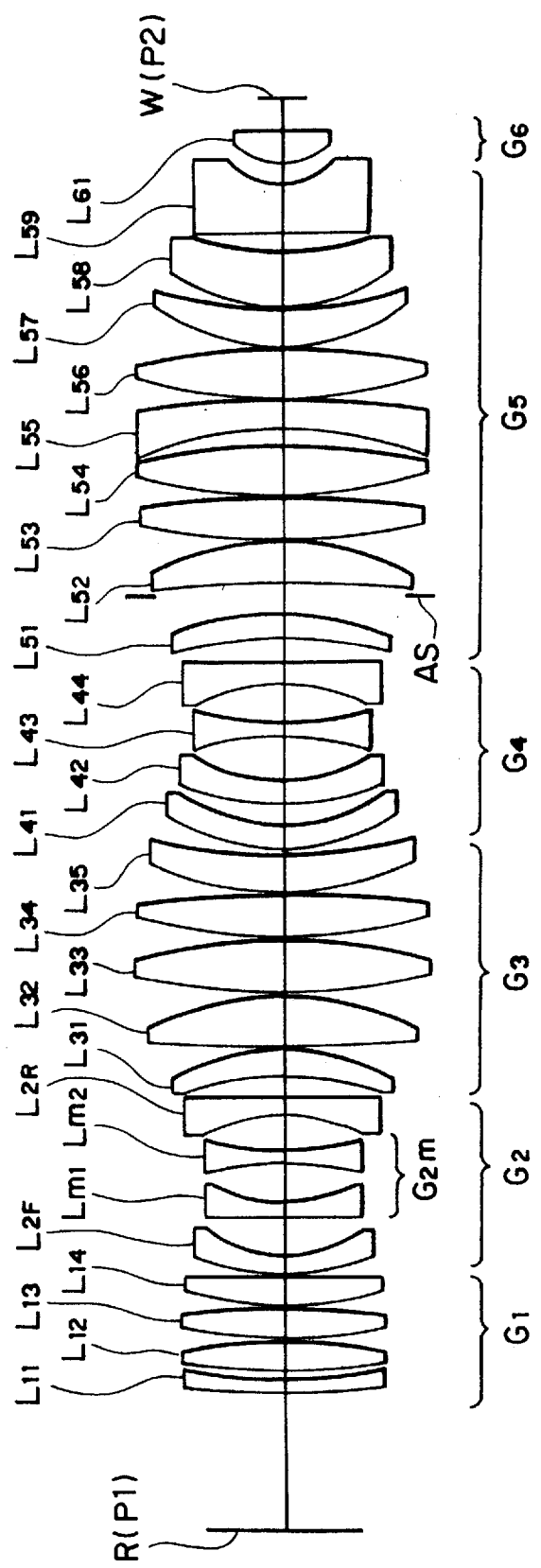
FIG. 4 is a drawing to show a lens layout of the first embodiment of the projection optical system according to the present invention.
Figure 5:
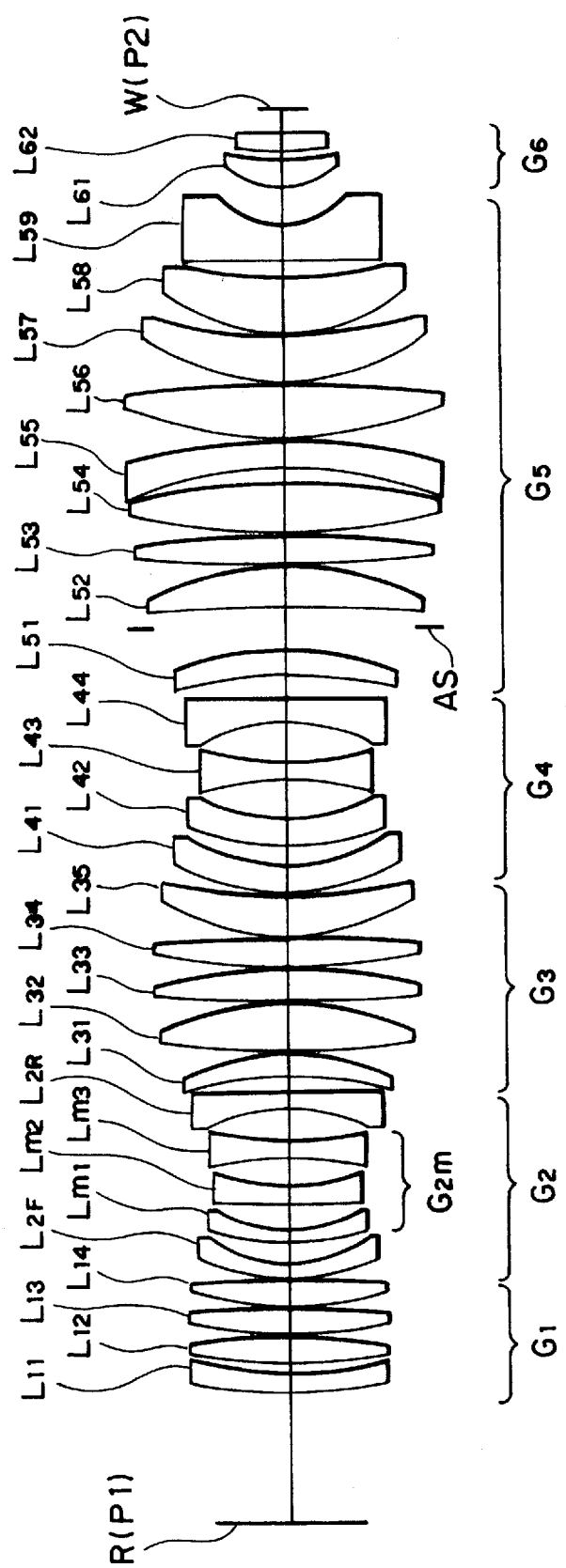
FIG. 5 is a drawing to show a lens layout of the second embodiment of the projection optical system according to the present invention.
Figure 6:
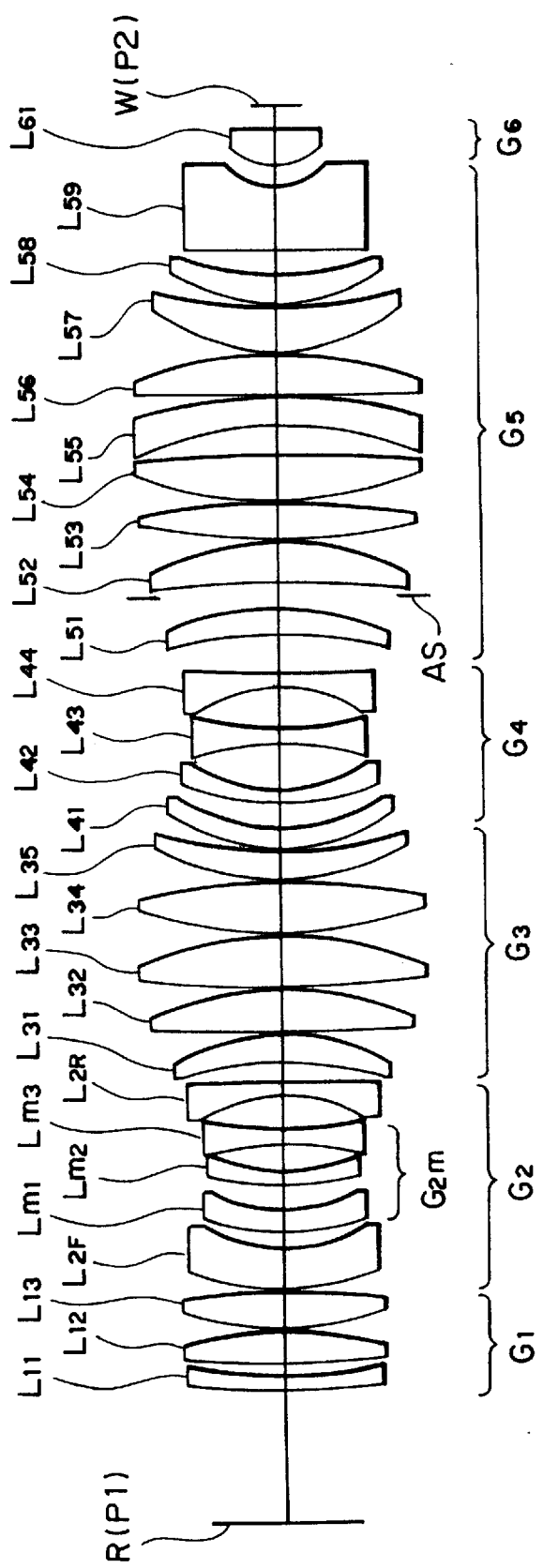
FIG. 6 is a drawing to show a lens layout of the third embodiment of the projection optical system according to the present invention.

Now, the following embodiments show examples of the projection optical system to which an excimer laser for supplying light having the exposure wavelength λ of 248.4 nm is applicable as a light source LS disposed inside the illumination optical system IS. FIG. 4 to FIG. 6 show lens layouts of the first to third embodiments of the projection optical system according to the present invention.

As shown in FIG. 4 to FIG. 6, the projection optical system in each lens layout is composed of, in order from the side of reticle R as a first object, the first lens group $G_1$ having a positive refractive power, the second lens group $G_2$ having a negative refractive power, the third lens group $G_3$ having a positive refractive power, the fourth lens group $G_4$ having a negative refractive power, the fifth lens group $G_5$ having a positive refractive power, and the sixth lens group $G_6$ having the positive refractive power. These examples of the projection optical system are approximately telecentric on the object side (on the reticle R side) and on the image side (on the wafer W side), and have demagnification factors.

In each projection optical system shown in FIG. 4 to FIG. 6, the object-image distance (the distance from the object plane P1 to the image plane P2 or the distance from the reticle R to the wafer W) L is 1000, the image-side numerical aperture NA is 0.6, the projection magnification B is ¼, and the diameter of the exposure area on the wafer W, of the projection optical system PL or the diagonal length of the slit exposure area on the wafer W is 26.4.

Next, the detailed lens layout of the first embodiment is explained referring to FIG. 4. First, the first lens group $G_1$ has, in order from the object side, a negative lens (negative meniscus lens) $L_{11}$ with a concave surface directed to the image side, two positive biconvex lenses $L_{12}$ and $L_{13}$, and a positive lens (biconvex lens) $L_{14}$ with a convex surface directed to the object side.

Further, the second lens group $G_2$ is composed of a negative meniscus lens (front lens) $L_{2F}$ disposed nearest to the object and having a concave surface directed to the image side, a negative meniscus lens (rear lens) $L_{2R}$ disposed nearest to the image side and having a concave surface directed to the object side, and an intermediate lens group $G_{2m}$ disposed between the negative meniscus lens $L_{2F}$ and the negative meniscus lens $L_{2R}$. Particularly, the intermediate lens group $G_{2m}$ is composed of negative lenses only. Specifically, the intermediate lens group $G_{2m}$ is composed of, in order from the object side, a negative lens (negative meniscus lens) $L_{m1}$ with a concave surface directed to the image side, and a negative biconcave lens $L_{m2}$.

The third lens group $G_3$ is composed of, in order from the object side, a positive lens (positive meniscus lens) $L_{31}$ with a convex surface directed to the image side, a positive lens (biconvex lens) $L_{32}$ with a convex surface directed to the image side, two positive biconvex lenses $L_{33}$ and $L_{34}$, and a positive lens (positive meniscus lens) $L_{35}$ with a convex surface directed to the object side. The fourth lens group $G_4$ is composed of, in order from the object side, two negative lenses (two negative meniscus lenses) $L_{41}$ and $L_{42}$ with their concave surfaces directed to the image side, a negative biconcave lens $L_{43}$, and a negative lens (biconcave lens) $L_{44}$ with a concave surface directed to the object side.

The fifth lens group $G_5$ is composed of seven positive lenses and two negative lenses. Specifically, the fifth lens group $G_5$ is composed of, in order from the object side, two positive meniscus lenses $L_{51}$ and $L_{52}$ with their convex surfaces directed to the image side, two positive biconvex lenses $L_{53}$ and $L_{54}$, a negative lens (negative meniscus lens) $L_{55}$ with a concave surface directed to the object side, a positive biconvex lens $L_{56}$, two positive lenses (two positive meniscus lenses) $L_{57}$ and $L_{58}$ with their convex surfaces directed to the object side, and a negative lens (negative meniscus lens) $L_{59}$ with a concave surface directed to the image side. The sixth lens group $G_6$ is composed of only a positive lens (positive meniscus lens) $L_{61}$ with a convex surface directed to the object side.

Here, in the first lens group $G_1$ of the first embodiment, the image-side lens surface of the negative lens (negative meniscus lens) $L_{11}$ with the concave surface directed to the image side and the object-side lens surface of the positive biconvex lens $L_{12}$ have like curvatures and are located relatively close to each other. These two lens surfaces correct higher-order distortions.

In the present embodiment, because the front lens $L_{2F}$ in the second lens group $G_2$ is formed in a meniscus shape with the concave surface directed to the image side, occurrence of coma is relieved. Further, because the rear lens $L_{2R}$ in the second lens group $G_2$ is formed in a meniscus shape with the concave surface directed to the object side, it can suppress occurrence of coma in combination with the front lens $L_{2F}$.

Further, because the intermediate lens group $G_{2m}$ in the second lens group $G_2$ is composed of the negative lenses only, occurrence of higher-order distortions is suppressed.

The fourth lens group $G_4$ is arranged, as described above, so that the negative lens $L_{41}$ with the concave surface directed to the image side is disposed on the object side of the negative biconcave lens $L_{43}$ and so that the negative lens $L_{44}$ with the concave surface directed to the object side is disposed on the image side of the negative biconcave lens $L_{43}$. Because of this arrangement the fourth lens group $G_4$ corrects Petzval sum as suppressing occurrence of coma.

The fifth lens group $G_5$ includes the seven positive lenses ($L_{51}$, $L_{52}$, $L_{53}$, $L_{54}$, $L_{56}$, $L_{57}$, $L_{58}$) as described above. Because of this arrangement the fifth lens group $G_5$ suppresses negative spherical aberration caused by the fifth lens group $G_5$ itself with an increase in NA. Further, in the fifth lens group $G_5$, the fourth positive lens $L_{54}$ from the object side has the convex surface opposed to the negative lens (negative meniscus lens) $L_{55}$ with the concave surface directed to the object side and also has the convex lens surface on the opposite side (object side) to the negative lens (negative meniscus lens) $L_{55}$ with the concave surface directed to the object side. Including this positive biconvex lens $L_{54}$, the fifth lens group $G_5$ suppresses occurrence of higher-order spherical aberrations, caused with an increase in NA. The first embodiment showed an example in which in order to suppress occurrence of higher-order spherical aberrations caused with an increase in NA, the fifth lens group $G_5$ was arranged to include the positive biconvex lens $L_{54}$ and the negative lens (negative meniscus lens) $L_{55}$ with the concave surface directed to the object side, arranged in the stated order from the object side. However, the above same effect can be obtained by arranging them in the reversed order and inverting the concave surface of the negative lens $L_{55}$ to the image side, specifically by arranging the negative lens (negative meniscus lens) $L_{55}$ with the concave surface directed to the image side and the positive biconvex lens $L_{54}$ in the stated order from the object side.

In this embodiment the aperture stop AS is disposed between the two positive meniscus lenses ($L_{51}$, $L_{52}$) located on the object side in the fifth lens group $G_5$. Basically, it is preferred to locate the aperture stop AS on the image side of the positive lens $L_{51}$ located nearest to the object in the fifth lens group $G_5$. It is because the aperture stop AS disposed at such a proper position suppresses higher-order spherical aberrations, which are likely to occur in the fifth lens group $G_5$ with an increase in NA.

Next, the lens layout of the second embodiment of the projection optical system according to the present invention is explained referring to FIG. 5. The second embodiment shown in FIG. 5 is different in lens layouts of the second lens group $G_2$, the fourth lens group $G_4$, and the sixth lens group $G_6$ from the first embodiment shown in FIG. 4.

In the second embodiment, the intermediate lens group $G_{2m}$ in the second lens group $G_2$ includes one more negative lens than that in the first embodiment does, and thus, is composed of three negative lenses. Specifically, the intermediate lens group $G_{2m}$ is composed of, in order from the object side, a negative lens (negative meniscus lens) $L_{m1}$ with a concave surface directed to the image side, a negative lens (plano-concave lens) $L_{m2}$ similarly with a concave surface directed to the image side, and a negative biconcave lens $L_{m3}$. This arrangement of the intermediate lens group $G_{2m}$ composed of the three negative lenses effectively suppresses coma, which is likely to occur in the intermediate lens group $G_{2m}$.

In the fourth lens group $G_4$ of the first embodiment, the negative lens $L_{44}$, disposed at the fourth position from the object side and having the concave surface directed to the object side, was a biconcave lens. In contrast, in the fourth lens group $G_4$ of the second embodiment, this negative lens $L_{44}$ is a plano-concave lens.

The sixth lens group $G_6$ of the second embodiment includes one more positive lens than that in the first embodiment does, and thus, is composed of two positive lenses. Specifically, the sixth lens group $G_6$ is composed of, in order from the object side, two positive lenses (positive meniscus lenses) $L_{61}$ and $L_{62}$ having their convex surfaces directed to the object side.

Next, the lens layout of the third embodiment of the projection optical system according to the present invention is explained referring to FIG. 6. The third embodiment shown in FIG. 6 is different in lens layouts of the first lens group $G_1$ and the second lens group $G_2$ from the first embodiment shown in FIG. 4.

The first lens group $G_1$ of the third embodiment includes positive lenses one less than those in the first embodiment, and thus, is composed of a negative lens and two positive lenses. Specifically, the first lens group $G_1$ has, in order from the object side, a negative lens (negative meniscus lens) $L_{11}$ with a concave surface directed to the image side, a positive biconvex lens $L_{12}$, and a positive lens (biconvex lens) $L_{13}$ with a convex surface directed to the object side.

The intermediate lens group $G_{2m}$ in the second lens group $G_2$ of the third embodiment includes one more positive lens than that in the first embodiment does, and thus, is composed of three negative lenses as in the second embodiment. Specifically, the intermediate lens group $G_{2m}$ is composed of, in order from the object side, two negative lenses (two negative meniscus lenses) $L_{m1}$ and $L_{m2}$ with their concave surfaces directed to the image side, and a negative biconcave lens $L_{m3}$. This arrangement of the intermediate lens group $G_{2m}$ composed of the three negative lenses effectively suppresses coma, which is likely to occur in the intermediate lens group $G_{2m}$.

Now, Tables 1-1, 1-2, 2-1, 2-2, 3-1, 3-2 below show specifications and condition correspondence values of the first to third embodiments according to the present invention.

In the tables, left-end numerals represent orders from the object side (reticle side), r radii of curvature of lens surfaces, d lens surface separations, n refractive indices of synthetic quartz $SiO_2$ at the exposure wavelength $\lambda$ of 248.4 nm, d0 a distance from the object plane (reticle plane) to the most object side (reticle side) lens surface (first lens surface) in the first lens group $G_1$ (FIG. 1), Bf a distance from the most image side (wafer side) lens surface in the sixth lens group $G_6$ to the image plane (wafer plane), B the projection magnification of the projection optical system, NA the image-side numerical aperture of projection optical system, L the object-image distance from the object plane (reticle plane) to the image plane (wafer plane), I the axial distance from the object plane (reticle plane) to the first object side focal point of the overall projection optical system (provided that the first object side focal point of the overall projection optical system means an intersecting point of emerging light therefrom with the optical axis of the projection optical system when parallel light in the paraxial region relative to the optical axis of projection optical system is incident into the projection optical system from the second object side thereof and the light in the paraxial region is emergent from the projection optical system), $f_1$ the focal length of the first lens group $G_1$, $f_2$ the focal length of the second lens group $G_2$, $f_3$ the focal length of the third lens group $G_3$, $f_4$ the focal length of the fourth lens group $G_4$, $f_5$ the focal length of the fifth lens group $G_5$, $f_6$ the focal length of the sixth lens group $G_6$, $f_{2F}$ the focal length of the front lens $L_{2F}$ disposed nearest to the object in the second lens group, having the concave surface directed to the image side, and having the negative refractive power, $f_{2R}$ the focal length of the rear lens $L_{2R}$ disposed nearest to the image in the second lens group, having the concave surface directed to the object side, and having the negative refractive power, $f_{2m}$ the composite focal length of the intermediate lens group $G_{2m}$ disposed between the front lens $L_{2F}$ and the rear lens $L_{2R}$ in the second lens group, $r_{51F}$ the radius of curvature of the object-side surface in the first positive meniscus lens $L_{51}$ disposed nearest to the object in the fifth lens group $G_5$, $r_{51R}$ the radius of curvature of the image-side lens surface in the first positive meniscus lens $L_{51}$ disposed nearest to the object in the fifth lens group $G_5$, $r_{52F}$ the radius of curvature of the object-side lens surface in the second positive meniscus lens $L_{52}$ disposed on the image side of the first positive meniscus lens $L_{51}$ in the fifth lens group $G_5$, $r_{52R}$ the radius of curvature of the image-side lens surface in the second positive meniscus lens $L_{52}$ disposed on the image side of the first positive meniscus lens $L_{51}$ in the fifth lens group $G_5$, $r_{5n}$ the radius of curvature of the concave surface in the negative meniscus lens $L_{55}$ disposed inside the fifth lens group $G_5$, $r_{5p}$ the radius of curvature of the convex surface opposed to the concave surface of the negative meniscus lens $L_{55}$, in the first positive lens $L_{54}$ disposed adjacent to the concave surface of the negative meniscus lens $L_{55}$ provided inside the fifth lens group $G_5$, $r_{5F}$ the radius of curvature of the object-side lens surface in the negative lens $L_{59}$ provided nearest to the image side in the fifth lens group $G_5$, $r_{5R}$ the radius of curvature of the image-side lens surface in the negative lens disposed nearest to the image side in the fifth lens group $G_5$, $r_{6F}$ the radius of curvature of the object-side lens surface in the negative lens $L_{59}$ disposed nearest to the object side in the sixth lens group $G_6$, $d_6$ the axial distance from the most object side lens surface in the sixth lens group $G_6$ to the image plane (see FIG. 1), and $\Phi$ the refractive power of a lens surface of a lens forming the sixth lens group $G_6$. Here, $Q_{51}=(r_{51F}-r_{51R})/(r_{51F}+r_{51R})$, and $Q_{52}=(r_{52F}-r_{52R})/(r_{52F}+r_{52R})$.

TABLE 1-1

Specifications of First Embodiment d0 = 95.002
B = 1/4
NA = 0.6
Bf = 20.930
L = 1000

| | r | d | n |
|---|---|---|---|
| 1 | 644.7879 | 10.000 | 1.50839 |
| 2 | 332.4125 | 5.236 | 1.00000 |
| 3 | 489.4379 | 22.153 | 1.50839 |
| 4 | −343.9589 | 1.000 | 1.00000 |
| 5 | 300.6049 | 21.654 | 1.50839 |
| 6 | −754.9399 | 1.000 | 1.00000 |
| 7 | 210.3952 | 21.411 | 1.50839 |
| 8 | −10084.177 | 1.000 | 1.00000 |
| 9 | 168.8944 | 12.667 | 1.50839 |
| 10 | 91.8488 | 25.761 | 1.00000 |
| 11 | 2506.147 | 11.953 | 1.50839 |
| 12 | 113.1104 | 26.722 | 1.00000 |
| 13 | −205.9002 | 10.000 | 1.50839 |
| 14 | 203.1437 | 25.660 | 1.00000 |
| 15 | −107.1775 | 12.552 | 1.50839 |
| 16 | −1383.124 | 13.743 | 1.00000 |
| 17 | −199.1651 | 18.849 | 1.50839 |
| 18 | −146.9585 | 1.000 | 1.00000 |
| 19 | 1633.508 | 36.177 | 1.50839 |
| 20 | −193.2242 | 1.000 | 1.00000 |
| 21 | 413.9511 | 37.469 | 1.50839 |
| 22 | −357.2763 | 1.000 | 1.00000 |

TABLE 1-1-continued

Specifications of First Embodiment

| | | | |
|---|---|---|---|
| 23 | 354.2471 | 30.129 | 1.50839 |
| 24 | −861.1354 | 1.000 | 1.00000 |
| 25 | 212.5816 | 26.345 | 1.50839 |
| 26 | 356.7634 | 2.859 | 1.00000 |
| 27 | 143.8041 | 17.274 | 1.50839 |
| 28 | 124.1645 | 13.618 | 1.00000 |
| 29 | 180.7435 | 16.532 | 1.50839 |
| 30 | 112.4036 | 32.761 | 1.00000 |
| 31 | −167.6385 | 10.000 | 1.50839 |
| 32 | 213.1012 | 28.093 | 1.00000 |
| 33 | −117.6042 | 14.657 | 1.50839 |
| 34 | 5213.975 | 17.248 | 1.00000 |
| 35 | −276.3001 | 16.851 | 1.50839 |
| 36 | −195.8018 | 23.163 | 1.00000 |
| 37 | −922.6360 | 28.973 | 1.50839 |
| 38 | −185.4831 | 1.000 | 1.00000 |
| 39 | 494.8513 | 30.000 | 1.50839 |
| 40 | −807.7331 | 1.000 | 1.00000 |
| 41 | 332.8630 | 35.786 | 1.50839 |
| 42 | −479.9890 | 12.295 | 1.00000 |
| 43 | −258.4556 | 18.000 | 1.50839 |
| 44 | −912.7617 | 1.000 | 1.00000 |
| 45 | 317.7747 | 35.863 | 1.50839 |
| 46 | −508.2967 | 1.000 | 1.00000 |
| 47 | 138.8578 | 27.975 | 1.50839 |
| 48 | 275.8559 | 1.000 | 1.00000 |
| 49 | 130.7218 | 39.838 | 1.50839 |
| 50 | 256.2264 | 9.310 | 1.00000 |
| 51 | 1265.876 | 36.609 | 1.50839 |
| 52 | 50.0034 | 13.611 | 1.00000 |
| 53 | 50.0565 | 22.273 | 1.50839 |
| 54 | 1595.011 | Bf | 1.00000 |

TABLE 1-2

Condition Correspondence Values of First Embodiment (1) f1/f3 = 1.405
(2) f2/f4 = 0.636
(3) f5/L = 0.0816
(4) f6/L = 0.101
(5) f2m/f2 = 2.049
(6) I/L = 3.498
(7) (r5p − r5n)/(r5p + r5n) = 0.300
(8) d6/r6F = 0.863
(9) (r5F − r5R)/(r5F + r5R) = 0.924
(10) Q52/Q51 = 3.901
(11) Q51 = 0.171
(12) f2F/f2R = 1.829
(13) 1/(φ · L) = 0.0985    (which is the value on the object-side lens surface of positive lens $L_{61}$)

TABLE 2-1

Specifications of Second Embodiment d0 = 95.002
B = 1/4
NA = 0.6
Bf = 18.512
L = 1000

| | r | d | n |
|---|---|---|---|
| 1 | 383.8269 | 14.026 | 1.50839 |
| 2 | 266.3250 | 5.499 | 1.00000 |
| 3 | 382.6191 | 19.919 | 1.50839 |
| 4 | −448.3326 | 0.999 | 1.00000 |
| 5 | 317.1354 | 18.251 | 1.50839 |
| 6 | −1063.684 | 0.969 | 1.00000 |
| 7 | 219.6658 | 19.484 | 1.50839 |
| 8 | −3489.739 | 0.979 | 1.00000 |

TABLE 2-1-continued

Specifications of Second Embodiment

| | | | |
|---|---|---|---|
| 9 | 153.9521 | 11.008 | 1.50839 |
| 10 | 93.7481 | 13.309 | 1.00000 |
| 11 | 172.1542 | 9.389 | 1.50839 |
| 12 | 103.2069 | 18.389 | 1.00000 |
| 13 | ∞ | 13.231 | 1.50839 |
| 14 | 146.4322 | 19.977 | 1.00000 |
| 15 | −247.3179 | 12.939 | 1.50839 |
| 16 | 264.8880 | 22.517 | 1.00000 |
| 17 | −120.3809 | 12.480 | 1.50839 |
| 18 | −1183.926 | 11.055 | 1.00000 |
| 19 | −236.1758 | 16.077 | 1.50839 |
| 20 | −155.0974 | 0.828 | 1.00000 |
| 21 | 606.2280 | 34.973 | 1.50839 |
| 22 | −197.8414 | 0.991 | 1.00000 |
| 23 | 1363.090 | 22.522 | 1.50839 |
| 24 | −385.0709 | 0.999 | 1.00000 |
| 25 | 434.6219 | 20.675 | 1.50839 |
| 26 | −1613.166 | 1.849 | 1.00000 |
| 27 | 162.2392 | 28.431 | 1.50839 |
| 28 | 477.5166 | 1.918 | 1.00000 |
| 29 | 158.6229 | 18.386 | 1.50839 |
| 30 | 122.0405 | 14.568 | 1.00000 |
| 31 | 192.4261 | 18.943 | 1.50839 |
| 32 | 116.7860 | 30.097 | 1.00000 |
| 33 | −180.8044 | 11.565 | 1.50839 |
| 34 | 193.6045 | 29.088 | 1.00000 |
| 35 | −117.6017 | 15.478 | 1.50839 |
| 36 | ∞ | 16.705 | 1.00000 |
| 37 | −281.8313 | 17.538 | 1.50839 |
| 38 | −197.0364 | 30.400 | 1.00000 |
| 39 | −1287.112 | 28.427 | 1.50839 |
| 40 | −205.2784 | 0.986 | 1.00000 |
| 41 | 1340.000 | 19.372 | 1.50839 |
| 42 | −734.1928 | 0.976 | 1.00000 |
| 43 | 425.9667 | 35.314 | 1.50839 |
| 44 | −452.4529 | 11.389 | 1.00000 |
| 45 | −266.5251 | 18.309 | 1.50839 |
| 46 | −417.4679 | 1.024 | 1.00000 |
| 47 | 281.1377 | 37.708 | 1.50839 |
| 48 | −873.6096 | 0.983 | 1.00000 |
| 49 | 166.9185 | 32.406 | 1.50839 |
| 50 | 344.9813 | 1.302 | 1.00000 |
| 51 | 131.2756 | 41.647 | 1.50839 |
| 52 | 358.3721 | 9.572 | 1.00000 |
| 53 | 1330.690 | 29.039 | 1.50839 |
| 54 | 63.7625 | 24.329 | 1.00000 |
| 55 | 61.9425 | 19.288 | 1.50839 |
| 56 | 161.9965 | 5.136 | 1.00000 |
| 57 | 194.7332 | 12.825 | 1.50839 |
| 58 | 1025.115 | Bf | 1.00000 |

TABLE 2-2

Condition Correspondence Values of Second Embodiment (1) f1/f3 = 1.492
(2) f2/f4 = 0.714
(3) f5/L = 0.0933
(4) f6/L = 0.138
(5) f2m/f2 = 1.883
(6) I/L = 3.609
(7) (r5p − r5n)/(r5p + r5n) = 0.259
(8) d6/r6F = 0.900
(9) (r5F − r5R)/(r5F + r5R) = 0.909
(10) Q52/Q51 = 4.094
(11) Q51 = 0.177
(12) f2F/f2R = 1.899
(13) 1/(φ · L) = 0.122    (which is the value on the object-side lens surface of positive lens $L_{61}$)
    1/(φ · L) = 0.383    (which is the value on the object-side lens surface of positive lens $L_{62}$)

TABLE 3-1

Specifications of Third Embodiment d0 = 95.003
B = 1/4
NA = 0.6
Bf = 16.467
L = 1000

|   | r | d | n |
|---|---|---|---|
| 1 | 844.6716 | 10.000 | 1.50839 |
| 2 | 337.4058 | 6.889 | 1.00000 |
| 3 | 759.1130 | 22.831 | 1.50839 |
| 4 | −262.0553 | 1.000 | 1.00000 |
| 5 | 217.6427 | 26.603 | 1.50839 |
| 6 | −534.9914 | 1.000 | 1.00000 |
| 7 | 183.8843 | 29.857 | 1.50839 |
| 8 | 111.4376 | 10.280 | 1.00000 |
| 9 | 193.5337 | 16.931 | 1.50839 |
| 10 | 115.6829 | 16.544 | 1.00000 |
| 11 | 245.1690 | 10.000 | 1.50839 |
| 12 | 127.6105 | 21.019 | 1.00000 |
| 13 | −190.1592 | 10.000 | 1.50839 |
| 14 | 283.0702 | 24.860 | 1.00000 |
| 15 | −104.8898 | 10.000 | 1.50839 |
| 16 | −1001.146 | 13.747 | 1.00000 |
| 17 | −222.1635 | 20.324 | 1.50839 |
| 18 | −143.8900 | 1.000 | 1.00000 |
| 19 | 7821.822 | 29.083 | 1.50839 |
| 20 | −237.2346 | 1.000 | 1.00000 |
| 21 | 824.8234 | 36.685 | 1.50839 |
| 22 | −255.2286 | 1.000 | 1.00000 |
| 23 | 293.9218 | 37.474 | 1.50839 |
| 24 | −509.7260 | 1.000 | 1.00000 |
| 25 | 183.5020 | 20.352 | 1.50839 |
| 26 | 292.6125 | 1.235 | 1.00000 |
| 27 | 134.6489 | 15.130 | 1.50839 |
| 28 | 129.1992 | 17.518 | 1.00000 |
| 29 | 188.6116 | 10.000 | 1.50839 |
| 30 | 106.7970 | 33.285 | 1.00000 |
| 31 | −183.1446 | 10.000 | 1.50839 |
| 32 | 181.7448 | 30.305 | 1.00000 |
| 33 | −109.9511 | 10.000 | 1.50839 |
| 34 | 2233.067 | 27.463 | 1.00000 |
| 35 | −293.9313 | 16.646 | 1.50839 |
| 36 | −195.3848 | 18.794 | 1.00000 |
| 37 | −949.1430 | 29.121 | 1.50839 |
| 38 | −188.4842 | 1.000 | 1.00000 |
| 39 | 556.4410 | 25.449 | 1.50839 |
| 40 | −538.4374 | 1.000 | 1.00000 |
| 41 | 273.3248 | 33.195 | 1.50839 |
| 42 | −1188.618 | 21.595 | 1.00000 |
| 43 | −226.4034 | 18.000 | 1.50839 |
| 44 | −416.9794 | 1.000 | 1.00000 |
| 45 | 6123.337 | 28.673 | 1.50839 |
| 46 | −288.3860 | 1.000 | 1.00000 |
| 47 | 134.0866 | 33.282 | 1.50839 |
| 48 | 388.5834 | 1.000 | 1.00000 |
| 49 | 126.7031 | 23.372 | 1.50839 |
| 50 | 224.8492 | 14.307 | 1.00000 |
| 51 | 1302.616 | 48.207 | 1.50839 |
| 52 | 51.4547 | 13.419 | 1.00000 |
| 53 | 49.0853 | 25.059 | 1.50839 |
| 54 | 524.5056 | Bf | 1.00000 |

TABLE 3-2

Condition Correspondence Values of Third Embodiment (1) f1/f3 = 1.851
(2) f2/f4 = 0.844
(3) f5/L = 0.0816
(4) f6/L = 0.108
(5) f2m/f2 = 1.953
(6) I/L = 3.560
(7) (r5p − r5n)/(r5p + r5n) = 0.680
(8) d6/r6F = 0.846
(9) (r5F − r5R)/(r5F + r5R) = 0.924
(10) Q52/Q51 = 3.320
(11) Q51 = 0.201
(12) f2F/f2R = 2.793
(13) $1/(\phi \cdot L)$ = 0.0966  (which is the value on the object-side lens surface of positive lens $L_{61}$)

In the first embodiment as described above, the object-side lens surface of the positive lens $L_{61}$ has the value of $1/|\Phi L|$=0.0985, thereby satisfying condition (13). In the second embodiment, the object-side lens surface of the positive lens $L_{61}$ has the value of $1/|\Phi L|$=0.122, and the object-side lens surface of the positive lens $L_{62}$ has the value of $1/|\Phi L|$=0.383. Thus, the both lens surfaces satisfy condition (13). In the third embodiment, the object-side lens surface of the positive lens $L_{61}$ has the value of $1/|\Phi L|$= 0.0966, thus satisfying condition (13). Therefore, the sixth lens group $G_6$ of each embodiment is composed of three or more lenses having at least one lens surface satisfying condition (13).

From the values of specifications of each embodiment as described above, it is understood that each embodiment achieves telecentricity on the object side (reticle side) and on the image side (wafer side) while securing a relatively wide exposure area and a large numerical aperture.

Next, FIGS. 7 to 11 are drawings to show various aberrations of the first embodiment of the projection optical system according to the present invention, having the lens layout shown in FIG. 4. Particularly, FIG. 7 is a drawing to show spherical aberration of the first embodiment, FIG. 8 astigmatism of the first embodiment, FIG. 9 distortion of the first embodiment, and FIG. 10 coma of the first embodiment. In these aberration diagrams of FIG. 7 to FIG. 10, NA represents the numerical aperture of the projection optical system and Y the image height. In FIG. 8 to show astigmatism, the dotted line indicates the meridional image surface and the solid line the sagittal image surface.

Figures 11, 12, 13:
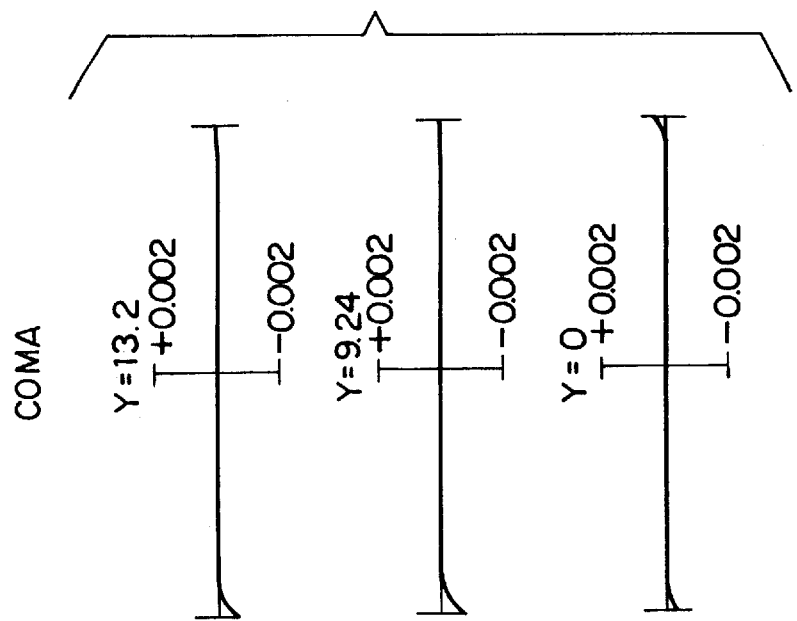
FIGS. 11 to 14 are drawings to show various aberrations in the second embodiment shown in FIG. 4.
Figure 14:
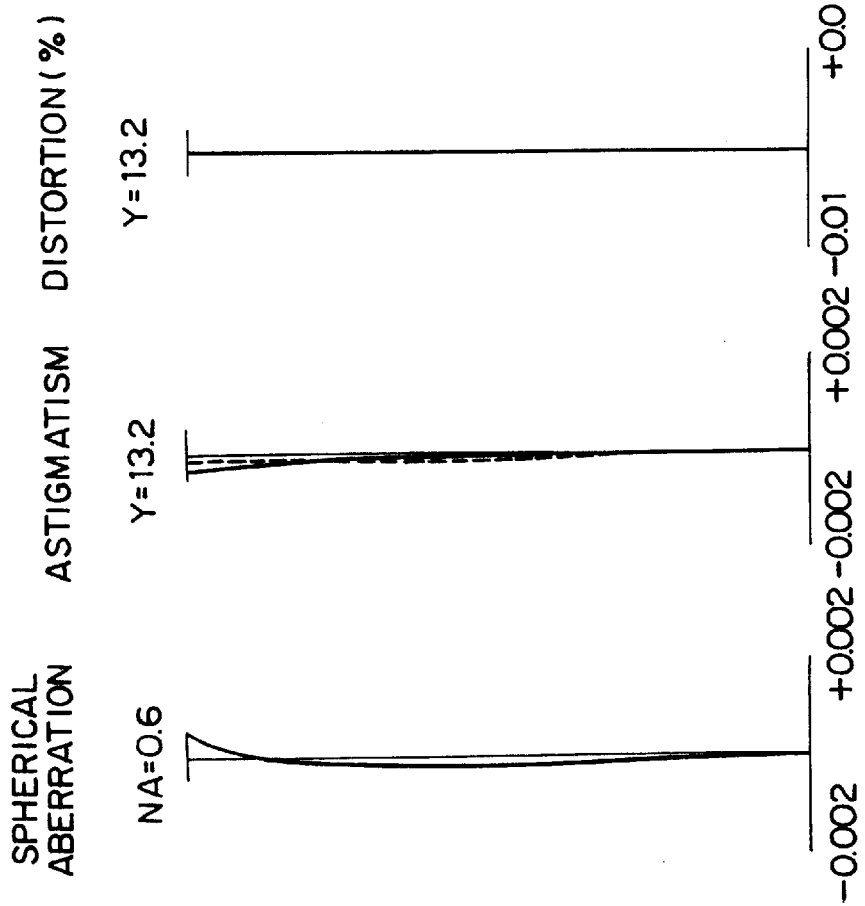

Similarly, FIGS. 11 to 14 are drawings to show various aberrations of the second embodiment of the projection optical system according to the present invention, having the lens layout shown in FIG. 5. Particularly, FIG. 11 is a diagram to show spherical aberration of the second embodiment, FIG. 12 astigmatism of the second embodiment, FIG. 13 distortion of the second embodiment, and FIG. 14 coma of the second embodiment. FIGS. 15 to 18 are drawings to show various aberrations of the third embodiment of the projection optical system according to the present invention, having the lens layout shown in FIG. 6. Particularly, FIG. 15 is a diagram to show spherical aberration of the third embodiment, FIG. 16 astigmatism of the third embodiment, FIG. 17 distortion of the third embodiment, and FIG. 18 coma of the third embodiment. Also in these aberration diagrams of FIGS. 11 to 18, NA represents the numerical aperture of the projection optical system and Y the image height.

Further, also in the aberration diagrams shown in FIGS. 12 and 16, the dotted line indicates the meridional image surface and the solid line the sagittal image surface.

From comparison of the aberration diagrams, each embodiment is corrected for various aberrations in a good balance. Particularly, the projection optical system is realized with a large numerical aperture reaching 0.6 and high resolving power while distortion is corrected very well over the entire image to an almost zero state.

The each embodiment above showed an example using the KrF excimer laser supplying light of 248.4 nm as a light source. Further, light sources applicable to the each embodiment include extreme ultraviolet light sources such as the ArF excimer laser supplying the light of 193 nm, a mercury arc lamp supplying the light of the g-line (436 nm) and the i-line (365 nm), and light sources supplying light in the ultraviolet region other than those.

In each embodiment, the lenses constituting the projection optical system are not cemented and all are made of a single optical material, that is, silica ($SiO_2$). Here, since each embodiment as described above is constructed of a single optical material, cost reduction is achieved. However, if the exposure light has some half-width, it is preferred to construct the projection optical system by a combination of lenses of silica ($SiO_2$) and lenses of fluorite ($CaF_2$) or a combination of lenses made of various types of different materials in order to correct chromatic aberration. Particularly, if the exposure light source has a wide band, it is effective to correction for chromatic aberration to construct the projection optical system by preparing plural types of lenses and combining these lenses.

Figure 19:
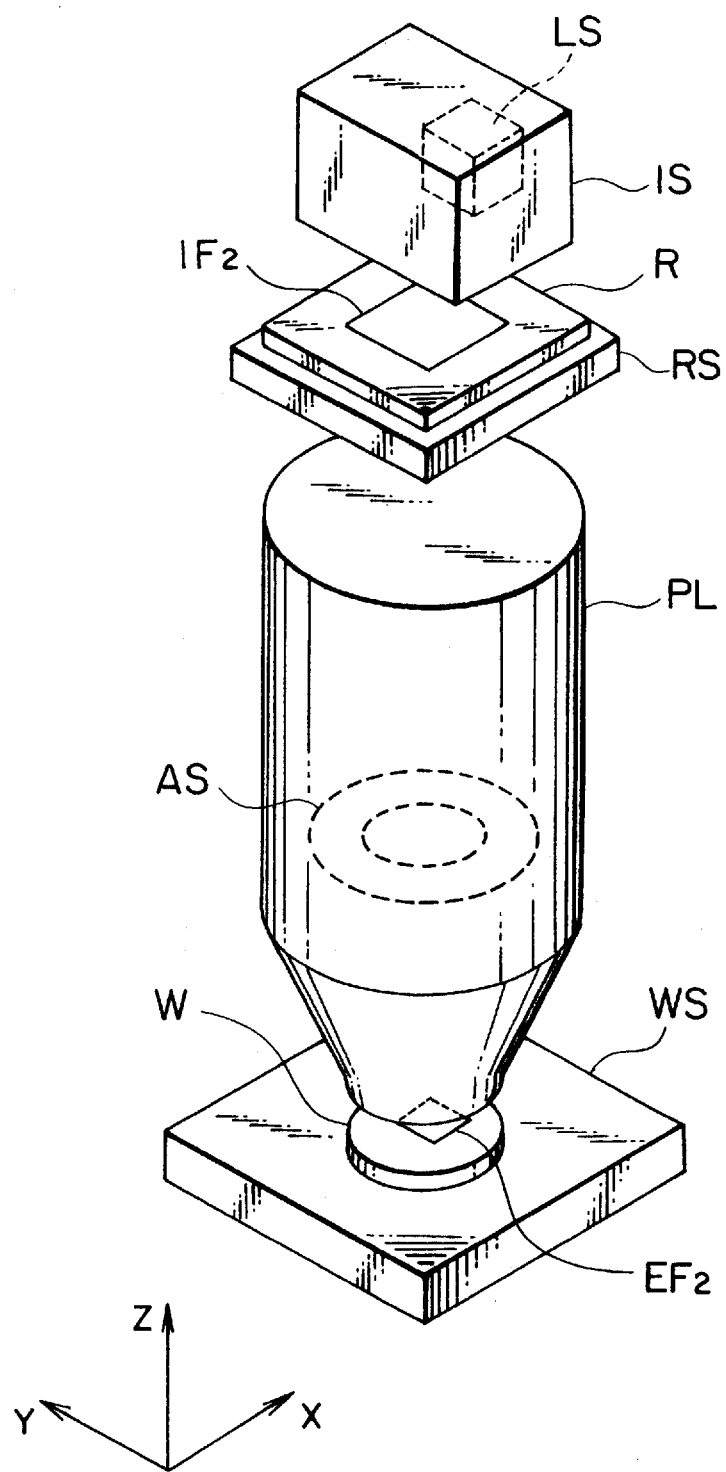
FIG. 19 is a drawing to show the schematic setup of an exposure apparatus of the one-shot exposure method to which the projection optical system according to the present invention can be applied.

Further, the examples of the projection optical system of the first to third embodiments were described as applications to the scanning exposure apparatus, as shown in FIG. 2. However, the exposure apparatus to which the projection optical system of the present invention can be applied include exposure apparatus of the one-shot exposure method for printing the patterns of reticle R on the wafer W by one shot, for example, as shown in FIG. 19.

As described above, the projection optical system according to the present invention is the bitelecentric optical system and realizes the high-resolving-power optical system as corrected for various aberrations in a good balance and having the large numerical aperture while securing a relatively wide exposure area. Particularly, the projection optical system of the present invention is corrected very well for distortion (including higher-order distortions). Accordingly, because the projection optical system of the present invention achieves not only bitelecentricity, but also very good correction for distortion, a decrease in image distortion is extreme.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

The basic Japanese Application Nos. 271631/1994 (6-271631) filed on Nov. 7, 1994, and 047142/1995 (7-047142) filed on Mar. 7, 1995, are hereby incorporated by reference.

What is claimed is:

1. A projection optical system for projecting an image of a first object onto a second object, comprising:
   a first lens group disposed between said first object and said second object and having a positive refractive power;
   a second lens group disposed between said first lens group and said second object and not including a positive lens, wherein said second lens group comprises,
   a front lens disposed nearest to said first object, having a concave surface directed to said second object, and having a negative refractive power,
   a rear lens disposed nearest to said second object, having a concave surface directed to said first object, and having a negative refractive power, and
   an intermediate lens group disposed between said front lens in the second lens group and said rear lens in the second lens group and having at least two negative lenses;
   a third lens group disposed between said second lens group and said second object and having a positive refractive power;
   a fourth lens group disposed between said third lens group and said second object and having a negative refractive power;
   a fifth lens group disposed between said fourth lens group and said second object and having a positive refractive power, wherein said fifth lens group comprises at least seven positive lenses; and
   a sixth lens group disposed between said fifth lens group and said second object and having a positive refractive power.

2. The projection optical system according to claim 1, wherein said first lens group comprises at least two positive lenses, said third lens group comprises at least three positive lenses, said fourth lens group comprises at least three negative lenses, said fifth group comprises said at least seven positive lenses and at least one negative lens, and said sixth lens group comprises at least one positive lens.

3. The projection optical system according to claim 1, wherein said fifth lens group comprises a negative meniscus lens and a first positive lens disposed adjacent to a concave surface of said negative meniscus lens and having a convex surface opposed to the concave surface of said negative meniscus lens.

4. The projection optical system according to claim 3, wherein said fifth lens group comprises at least one second positive lens on the side of a convex surface of said negative meniscus lens, and
   wherein said fifth lens group comprises at least one third positive lens on the opposite side to said negative meniscus lens with respect to said first positive lens disposed adjacent to the concave surface of said negative meniscus lens.

5. The projection optical system according to claim 1, wherein said fifth lens group comprises a negative lens disposed nearest to said second object and having a concave surface directed to said second object.

6. The projection optical system according to claim 1, wherein said fifth lens group comprises a first positive meniscus lens disposed nearest to said first object and having a convex surface directed to said second object, a second positive meniscus lens disposed on the side of said second object with respect to said first positive meniscus lens and having a convex surface directed to said second object, and an aperture stop disposed between said first positive meniscus lens and said second positive meniscus lens.

7. A projection optical system for projecting an image of a first object onto a second object, comprising:
   a first lens group disposed between said first object and said second object and having a positive refractive power;
   a second lens group disposed between said first lens group and said second object and not including a positive lens, wherein said second lens group comprises,
   a front lens disposed nearest to said first object, having a concave surface directed to said second object, and having a negative refractive power, a rear lens disposed nearest to said second object, having a concave surface directed to said first object, and having a negative refractive power, and an intermediate lens group disposed between said front lens in the second lens group and said rear lens in the second lens group and having at least two negative lenses;

a third lens group disposed between said second lens group and said second object and having a positive refractive power;

a fourth lens group disposed between said third lens group and said second object and having a negative refractive power;

a fifth lens group disposed between said fourth lens group and said second object and having a positive refractive power, wherein said fifth lens group comprises at least seven positive lenses; and a sixth lens group disposed between said fifth lens group and said second object and having a positive refractive power, said projection optical system satisfying the following conditions:

$$0.1 < f_1/f_3 < 17$$

$$0.05 < f_2/f_4 < 7$$

$$0.01 < f_5/L < 0.9$$

$$0.02 < f_6/L < 1.6$$

$$1.1 < f_{2m}/f_2 < 9$$

where $f_1$ is a focal length of said first lens group, $f_2$ a focal length of said second lens group, $f_3$ a focal length of said third lens group, $f_4$ a focal length of said fourth lens group, $f_5$ a focal length of said fifth lens group, $f_6$ a focal length of said sixth lens group, $f_{2m}$ a composite focal length of the intermediate lens group in said second lens group, and L a distance from said first object to said second object.

8. The projection optical system according to claim 7, which satisfies the following condition:

$$1.0 < I/L$$

where I is an axial distance from said first object to a first object side focal point of the whole of said projection optical system and L the distance from said first object to said second object.

9. The projection optical system according to claim 7, wherein said fifth lens group comprises a negative meniscus lens and a first positive lens of said at least seven positive lenses disposed adjacent to a concave surface of said negative meniscus lens and having a convex surface opposed to the concave surface of said negative meniscus lens, and wherein said fifth lens group satisfies the following condition:

$$0 < (r_{5p} - r_{5n})/(r_{5p} + r_{5n}) < 1$$

where $r_{5n}$ is a radius of curvature of said concave surface of said negative meniscus lens in said fifth lens group and $r_{5p}$ a radius of curvature of said convex surface opposed to the concave surface of said negative meniscus lens, in said first projection lens in said fifth lens group.

10. The projection optical system according to claim 9, wherein said fifth lens group comprises at least one second positive lens on the side of a convex surface of said negative meniscus lens, and wherein said fifth lens group comprises at least one third positive lens on the opposite side to said negative meniscus lens with respect to said first positive lens disposed adjacent to the concave surface of said negative meniscus lens.

11. The projection optical system according to claim 7, wherein said sixth lens group satisfies the following condition:

$$0.50 < d_6/r_{6F} < 1.50$$

where $r_{6F}$ is a radius of curvature of a lens surface nearest to the first object in said sixth lens group and $d_6$ an axial distance from the lens surface nearest to the first object in said sixth lens group to the second object.

12. The projection optical system according to claim 7, wherein said fifth lens group comprises a negative lens disposed nearest to said second object and having a concave surface directed to said second object.

13. The projection optical system according to claim 12, wherein said fifth lens group satisfies the following condition:

$$0.30 < (r_{5F} - r_{5R})/(r_{5F} + r_{5R}) < 1.28$$

where $r_{5F}$ is a radius of curvature of a first-object-side lens surface of said negative lens disposed nearest to said second object in said fifth lens group and $r_{5R}$ a radius of curvature of the second-object-side lens surface of said negative lens disposed nearest to said second object in said fifth lens group.

14. The projection optical system according to claim 7, wherein said fifth lens group comprises a first positive meniscus lens disposed nearest to said first object and having a convex surface directed to said second object and a second positive meniscus lens disposed on the side of said second object with respect to said positive meniscus lens and having a convex surface directed to said second object, and wherein said fifth lens group satisfies the following condition:

$$1.2 < Q_{52}/Q_{51} < 8$$

where $Q_{51} = (r_{51F} - r_{51R})/(r_{51F} + r_{51R})$ $Q_{52} = (r_{52F} - r_{52R})/(r_{52F} - r_{52R})$ where $r_{51F}$ is a radius of curvature of a first-object-side lens surface of said first positive meniscus lens, $r_{51R}$ a radius of curvature of the second-object-side lens surface of said first positive meniscus lens, $r_{52F}$ a radius of curvature of a first-object-side lens surface of said second positive meniscus lens, and $r_{52R}$ a radius of curvature of the second-object-side lens surface of said second positive meniscus lens.

15. The projection optical system according to claim 14, wherein said fifth lens group satisfies the following condition:

$$0.01 < Q_{51} < 0.8$$

where $Q_{51} = (r_{51F} - r_{51R})/(r_{51F} + r_{51R})$ where $r_{51F}$ is the radius of curvature of the first-object-side lens surface of said first positive meniscus lens in said fifth lens group and $r_{51R}$ the radius of curvature of the second-object-side lens surface of said first positive meniscus lens in said fifth lens group.

16. The projection optical system according to claim 14, further comprising an aperture stop disposed between said first positive meniscus lens and said second positive meniscus lens.

17. The projection optical system according to claim 7, wherein said second lens group satisfies the following condition:

$$0 \leq f_{2F}/f_{2R} < 18$$

where $f_{2F}$ is a focal length of said front lens in said second lens group and $f_{2R}$ a focal length of said rear lens in said second lens group.

18. The projection optical system according to claim 7, wherein said first lens group comprises at least two positive lenses, said third lens group comprises at least three positive lenses, said fourth lens group comprises at least three negative lenses, said fifth lens group comprises said at least seven positive lenses and at least one negative lens, and said sixth lens group comprises at least one positive lens.

19. The projection optical system according to claim 7, wherein said sixth lens group comprises three or less lenses and each lens has at least one lens surface satisfying the following condition:

$$1/|\Phi L| < 20$$

where $\Phi$: a refractive power of said lens surface
L: the distance from said first object to said second object.

20. The projection optical system according to claim 7, wherein a magnification of said projection optical system is ¼.

21. An exposure apparatus comprising:
a first stage capable of holding a photosensitive substrate on a main surface thereof;
an illumination optical system for emitting exposure light of a predetermined wavelength to transfer a predetermined pattern on a mask onto said substrate;
a second stage for holding said mask; and
a projection optical system disposed between said first stage and said second stage, for projecting an image of said mask onto said substrate, wherein said projection optical system comprises:
a first lens group disposed between said first stage and said second stage and having a positive refractive power;
a second lens group disposed between said first lens group and said first stage and not including a positive lens, wherein said second lens group comprises,
a front lens disposed nearest to said second stage, having a concave surface directed to said first stage, and having a negative refractive power,
a rear lens disposed nearest to said first stage, having a concave surface directed to said second stage, and having a negative refractive power, and
an intermediate lens group disposed between said front lens in the second lens group and said rear lens in the second lens group and having at least two negative lenses;
a third lens group disposed between said second lens group and said first stage and having a positive refractive power;
a fourth lens group disposed between said third lens group and said first stage and having a negative refractive power;
a fifth lens group disposed between said fourth lens group and said first stage and having a positive refractive power, wherein said fifth lens group comprises at least seven positive lenses; and
a sixth lens group disposed between said fifth lens group and said first stage and having a positive refractive power.

22. The exposure apparatus according to claim 21, wherein said projection optical system satisfies the following conditions:

$$0.1 < f_1/f_3 < 17$$
$$0.05 < f_2/f_4 < 7$$
$$0.01 < f_5/L < 0.9$$
$$0.02 < f_6/L < 1.6$$
$$1.1 < f_{2m}/f_2 < 9$$

where $f_1$ is a focal length of said first lens group, $f_2$ a focal length of said second lens group, $f_3$ a focal length of said third lens group, $f_4$ a focal length of said fourth lens group, $f_5$ a focal length of said fifth lens group, $f_6$ a focal length of said sixth lens group, $f_{2m}$ a composite focal length of the intermediate lens group in said second lens group, and L a distance from an object plane on said mask to an image plane on said substrate.

23. The projection optical system according to claim 8, wherein said first lens group comprises at least two positive lenses, said third lens group comprises at least three positive lenses, said fourth lens group comprises at least three negative lenses, said fifth lens group comprises said at least seven positive lenses and at least one negative lens, and said sixth lens group comprises at least one positive lens.

24. The projection optical system according to claim 23, wherein said fifth lens group comprises a negative meniscus lens and a first positive lens of said at least seven positive lenses disposed adjacent to a concave surface of said negative meniscus lens and having a convex surface opposed to the concave surface of said negative meniscus lens, and wherein said fifth lens group satisfies the following condition:

$$0 < (r_{5p} - r_{5n})/(r_{5p} + r_{5n}) < 1$$

where $r_{5n}$ is a radius of curvature of said concave surface of said negative meniscus lens in said fifth lens group and $r_{5p}$ a radius of curvature of said convex surface opposed to the concave surface of said negative meniscus lens, in said first positive lens in said fifth lens group.

25. The projection optical system according to claim 24, wherein said fifth lens group comprises at least one second positive lens on the side of a convex surface of said negative meniscus lens, and
wherein said fifth lens group comprises at least one third positive lens on the opposite side to said negative meniscus lens with respect to said first positive lens disposed adjacent to the concave surface of said negative meniscus lens.

26. The projection optical system according to claim 25, wherein said fifth lens group comprises a negative lens disposed nearest to said second object and having a concave surface directed to said second object.

27. The projection optical system according to claim 26, wherein said sixth lens group satisfies the following condition:

$$0.50 < d_6/r_{6F} < 1.50$$

where $r_{6F}$ is a radius of curvature of a lens surface nearest to the first object in said sixth lens group and $d_6$ an axial distance from the lens surface nearest to the first object in said sixth lens group to the second object.

28. The projection optical system according to claim 27, wherein said fifth lens group satisfies the following condition:

$$0.30<(r_{5F}-r_{5R})/(r_{5F}+r_{5R})<1.28$$

where $r_{5F}$ is a radius of curvature of a first-object-side lens surface of said negative lens disposed nearest to said second object in said fifth lens group and $r_{5R}$ a radius of curvature of the second-object-side lens surface of said negative lens disposed nearest to said second object in said fifth lens group.

29. A method for fabricating at least semiconductor devices or liquid crystal display devices, comprising the steps of:

preparing a projection optical system for projecting an image of a first object onto a second object, said projection optical system comprising:

a first lens group disposed between said first object and said second object and having a positive refractive power;

a second lens group disposed between said first lens group and said second object and not including a positive lens, wherein said second lens group comprises, a front lens disposed nearest to said first object, having a concave surface directed to said second object, and having a negative refractive power, a rear lens disposed nearest to said second object, having a concave surface directed to said first object, and having a negative refractive power, and an intermediate lens group disposed between said front lens in the second lens group and said rear lens in the second lens group and having at least two negative lenses a third lens group disposed between said second lens group and said second object and having a positive refractive power;

a fourth lens group disposed between said third lens group and said second object and having a negative refractive power;

a fifth lens group disposed between said fourth lens group and said second object and having a positive refractive power, wherein said fifth lens group comprises at least seven positive lenses; and a sixth lens group disposed between said fifth lens group and said second object and having a positive refractive power, wherein said projection optical system satisfies the following conditions $$0.1<f_1/f_3<17$$

$$0.05<f_2/f_4<7$$

$$0.01<f_5/L<0.9$$

$$0.02<f_6/L<1.6$$

$$1.1<f_{2m}/f_2<9$$

where $f_1$ is a focal length of said first lens group, $f_2$ a focal length of said second lens croup, $f_3$ a focal length of said third lens group, $f_4$ a focal length of said fourth lens group, $f_5$ a focal length of said fifth lens group, $f_6$ a focal length of said sixth lens group, $f_{2m}$ a composite focal length of the intermediate lens group in said second lens group, and L a distance from said first object to said second object, wherein said projection optical system satisfies the following condition:

$$1.0<I/L$$

where I is an axial distance from said first object to a first object side focal point of the whole of said projection optical system and L the distance from said first object to said second object, wherein said first lens group comprises at least two positive lenses, said third lens group comprises at least three positive lenses, said fourth lens group comprises at least three negative lenses, said fifth lens group comprises said at least seven positive lenses and at least one negative lens, and said sixth lens group comprises at least one positive lens, wherein said fifth lens group comprises a negative meniscus lens and a first positive lens of said at least seven positive lenses disposed adjacent to a concave surface of said negative meniscus lens and having a convex surface opposed to the concave surface of said negative meniscus lens, wherein said fifth lens group satisfies the following condition:

$$0<(r_{5p}-r_{5n})/(r_{5p}+r_{5n})<1$$

where $r_{5n}$ is a radius of curvature of said concave surface of said negative meniscus lens in said fifth lens group and $r_{5p}$ a radius of curvature of said convex surface opposed to the concave surface of said negative meniscus lens, in said first positive lens an said fifth lens group, wherein said fifth lens group comprises at least one second positive lens on the side of a convex surface of said negative meniscus lens, and wherein said fifth lens group comprises at least one third positive lens on the opposite side to said negative meniscus lens with respect to said first positive lens disposed adjacent to the concave surface of said negative meniscus lens;

illuminating a mask prepared as said first object with light having a predetermined wavelength, said mask being formed a predetermined pattern thereon; and projecting an image of the pattern on said mask onto a photosensitive substrate prepared as said second object through said projection optical system, thereby performing an exposure process.

30. The method according to claim 29, wherein in said exposure process, said mask and said substrate move with respect to said projection optical system, while projecting the image of the pattern on said mask onto said substrate through said projection optical system.

31. The projection optical system according to claim 12, wherein said sixth lens group satisfies the following condition:

$$0.50<d_6/r_{6F}<1.50$$

where $r_{6F}$ is a radius of curvature of a lens surface nearest to the first object in said sixth lens group and $d_6$ an axial distance from the lens surface nearest to the first object in said sixth lens group to the second object.

32. The projection optical system according to claim 31, which satisfies the following condition:

$$1.0 < I/L$$

where I is an axial distance from said first object to a first object side focal point of the whole of said projection optical system and L the distance from said first object to said second object.

33. The projection optical system according to claim 32, wherein said first lens group comprises at least two positive lenses, said third lens group comprises at least three positive lenses, said fourth lens group comprises at least three negative lenses, said fifth lens group comprises said at least seven positive lenses and at least one negative lens, and said sixth lens group comprises at least one positive lens.

34. The projection optical system according to claim 33, wherein said fifth lens group satisfies the following condition:

$$0.30 < (r_{5F} - r_{5R})/(r_{5F} + r_{5R}) < 1.28$$

where $r_{5F}$ is a radius of curvature of a first-object-side lens surface of said negative lens disposed nearest to said second object in said fifth lens group and $r_{5R}$ a radius of curvature of the second-object-side lens surface of said negative lens disposed nearest to said second object in said fifth lens group.

35. The projection optical system according to claim 33, wherein said second lens group satisfies the following condition:

$$0 \leq f_{2F}/f_{2R} < 18$$

where $f_{2F}$ is a focal length of said front lens in said second lens group and $f_{2R}$ a focal length of said rear lens in said second lens group.

36. The projection optical system according to claim 35, wherein said sixth lens group comprises three or less lenses and each lens has at least one lens surface satisfying the following condition:

$$1/|\Phi L| < 20$$

where $\Phi$: a refractive power of said lens surface

L: the distance from said first object to said second object.

37. A method for fabricating at least semiconductor devices or liquid crystal display devices, comprising the steps of:

preparing a projection optical system for projecting an image of a first object onto a second object, said projection optical system comprising:

a first lens group disposed between said first object and said second object and having a positive refractive power;

a second lens group disposed between said first lens group and said second object and not including a positive lens, wherein said second lens group comprises, a front lens disposed nearest to said first object, having a concave surface directed to said second object, and having a negative refractive power, a rear lens disposed nearest to said second object, having a concave surface directed to said first object, and having a negative refractive power, and an intermediate lens group disposed between said front lens in the second lens group and said rear lens in the second lens group and having at least two negative lenses;

a third lens group disposed between said second lens group and said second object and having a positive refractive power;

a fourth lens group disposed between said third lens group and said second object and having a negative refractive power;

a fifth lens group disposed between said fourth lens group and said second object and having a positive refractive power, wherein said fifth lens group comprises at least seven positive lenses; and a sixth lens group disposed between said fifth lens group and said second object and having a positive refractive power, wherein said projection optical system satisfies the following conditions:

$$0.1 < f_1/f_3 < 17$$

$$0.05 < f_2/f_4 < 7$$

$$0.01 < f_5/L < 0.9$$

$$0.02 < f_6/L < 1.6$$

$$1.1 < f_{2m}/f_2, < 9$$

wherein $f_1$, is a Local length of said first lens group, $f_2$ a focal length of said second lens group, $f_3$ a focal length of said third lens group, $f_4$ a focal length of said fourth length group, $f_5$ a focal length of said fifth lens group, $f_6$ a focal length of said sixth lens group, $f_{2m}$ a composite focal length of the intermediate lens group in said second lens group, and L a distance from said first object to said second object, wherein said fifth lens group comprises a negative lens disposed nearest to said second object and having a concave surface directed to said second object, and wherein said sixth lens group satisfies the following condition:

$$0.50 < d_6/r_{6f} < 1.50$$

where $r_{6f}$ is a radius of curvature of a lens surface nearest to the first object in said sixth lens group and $d_6$ an axial distance from the lens surface nearest to the first object in said sixth lens group to the second object;

illuminating a mask prepared as said first object with light having a predetermined wavelength, said mask being formed a predetermined pattern thereon; and projecting an image of the pattern on said mask onto a photosensitive substrate prepared as said second object through said projection optical system, thereby performing an exposure process.

38. The method according to claim 37, wherein in said exposure process, said mask and said substrate move with respect to said projection optical system, while projecting the image of the pattern on said mask onto said substrate through said projection optical system.

39. The projection optical system according to claim 22, wherein said fifth lens group comprises a negative meniscus lens and a first positive lens of said at least seven positive lenses disposed adjacent to a concave surface of said negative meniscus lens and having a convex surface opposed to the concave surface of said negative meniscus lens, and wherein said fifth lens group satisfies the following condition:

$$0 < (r_{5p} - r_{5n})/(r_{5p} + r_{5n}) < 1$$

where $r_{5n}$ is a radius of curvature of said concave surface of said negative meniscus lens in said fifth lens group and $r_{5P}$ a radius of curvature of said convex surface opposed to the concave surface of said negative meniscus lens, in said first positive lens in said fifth lens group.

40. The projection optical system according to claim 39, wherein said fifth lens group comprises at least one second positive lens on the side of a convex surface of said negative meniscus lens, and wherein said fifth lens group comprises at least one third positive lens on the opposite side to said negative meniscus lens with respect to said first positive lens disposed adjacent to the concave surface of said negative meniscus lens.

41. The projection optical system according to claim 40, which satisfies the following condition:

$$1.0 < I/L$$

where I is an axial distance from said first object to a first object side focal point of the whole of said projection optical system and L the distance from said first object to said second object.

42. The exposure apparatus according to claim 21, wherein said first stage and said second stage are movable, while projecting the image of the pattern on said mask onto said substrate through said projection optical system.

43. The exposure apparatus according to claim 22, wherein said first stage and said second stage are movable, while projecting the image of the pattern on said mask onto said substrate through said projection optical system.

44. The exposure apparatus according to claim 41, wherein said first stage and said second stage are movable, while projecting the image of the pattern on said mask onto said substrate through said projection optical system.

45. A method for fabricating at least semiconductor devices or liquid crystal display devices, comprising the steps of:

preparing a projection optical system for protecting an image of a first object onto a second object, said projection optical system comprising:

a first lens group disposed between said first object and said second object and having a positive refractive power;

a second lens group disposed between said first lens group and said second object and not including a positive lens, wherein said second lens group comprises, a front lens disposed nearest to said first object, having a concave surface directed to said second object, and having a negative refractive power, a rear lens disposed nearest to said second object, having a concave surface directed to said first object, and having a negative refractive power, and an intermediate lens group disposed between said front lens in the second lens group and said rear lens in the second lens group and having at least two negative lenses;

a third lens group disposed between said second lens group and said second object and having a positive refractive power;

a fourth lens group disposed between said third lens group and said second object and having a negative refractive power;

a fifth lens group disposed between said fourth lens group and said second object and having a positive refractive power, wherein said fifth lens group comprises at least seven positive lenses; and a sixth lens group disposed between said fifth lens group and said second object and having a positive refractive power;

illuminating a mask prepared as said first object with light having a predetermined wavelength, said mask being formed a predetermined pattern thereon; and projecting an image of the pattern on said mask onto a photosensitive substrate prepared as said second object through said projection optical system, thereby performing an exposure process.

46. The method according to claim 45, wherein in said exposure process, said mask and said substrate move with respect to said projection optical system, while projecting the image of the pattern on said mask onto said substrate through said projection optical system.

47. A method for fabricating at least semiconductor devices or liquid crystal display devices, comprising the steps of:

preparing a projection optical system for projecting an image of a first object onto a second object, said projection optical system comprising:

a first lens group disposed between said first object and said second object and having a positive refractive power;

a second lens group disposed between said first lens group and said second object and not including a positive lens, wherein said second lens group comprises, a front lens disposed nearest to said first object, having a concave surface directed to said second object, and having a negative refractive power, a rear lens disposed nearest to said second object, having a concave surface directed to said first object, and having a negative refractive power, and an intermediate lens group disposed between said front lens in the second lens group and said rear lens in the second lens group and having at least two negative lenses;

a third lens group disposed between said second lens group and said second object and having a positive refractive power;

a fourth lens group disposed between said third lens group and said second object and having a negative refractive power;

a fifth lens group disposed between said fourth lens group and having a positive refractive power, wherein said fifth lens group comprises at least seven positive lenses; and a sixth lens group disposed between said fifth lens group and said second object and having a positive refractive power, wherein said projection optical system satisfies the following conditions:

$$0.1 < f_1/f_3 < 17$$

$$0.05 < f_2/f_4 < 7$$

$$0.01 < f_5/L < 0.9$$

$$0.02 < f_6/L < 1.6$$

$$1.1 < f_{2m}/f_2 < 9$$

where $f_1$ is a focal length of said first lens group, $f_2$ a focal length of said second lens group, $f_3$ a focal length of said third lens group, $f_4$ a focal length of said fourth lens group, $f_5$ a focal length of said fifth lens group, $f_6$ a focal length of said sixth lens group, $f_{2m}$ a composite focal length of the intermediate lens group in said second lens group, and L a distance from said first object to said second object to said object;

illuminating a mask prepared as said first object with light having a predetermined wavelength, said mask being formed a predetermined pattern thereon; and projecting an image of the pattern on said mask onto a photosensitive substrate prepared as said second object through said projection optical system, thereby performing an exposure process.

48. The method according to claim 47, wherein in said exposure process, said mask and said substrate move with respect to said projection optical system, while projecting the image of the pattern on said mask onto said substrate through said projection optical system.

49. A projection optical system for projecting an image of a first object onto a second object, comprising:

a first lens group disposed between said first object and said second object and having a positive refractive power;

a second lens group disposed between said first lens group and said second object and not including a positive lens, wherein said second lens group comprises, a front lens disposed nearest to said first object, having a concave surface directed to said second object, and having a negative refractive power, a rear lens disposed nearest to said second object, having a concave surface directed to said first object, and having a negative refractive power, and an intermediate lens group disposed between said front lens in the second lens group and said rear lens in the second lens group and having at least two negative lenses;

a third lens group disposed between said second lens group and said second object and having a positive refractive power;

a fourth lens group disposed between said third lens group and said second object and having a negative refractive power;

a fifth lens group disposed between said fourth lens group and said second object and having a positive refractive power; and a sixth lens group disposed between said fifth lens group and said second object and having a positive refractive power;

wherein said fourth lens group comprises a biconcave lens, a first negative lens disposed on said first object side of said biconcave lens and having a concave surface directed to said second object, and a second negative lens disposed on said second object side of said biconcave lens and having a concave surface directed to said first object, and wherein said fifth lens group comprises a negative meniscus lens and a first positive lens disposed adjacent to a concave surface of said negative meniscus lens and having a convex surface opposed to the concave surface of said negative meniscus lens.

50. The projection optical system according to claim 49, wherein said fifth lens group satisfies the following condition:

$0<(r_{5P}-r_{5n})/(r_{5P}+r_{5n})<1$ where $r_{5n}$ is a radius of curvature of said concave surface of said negative meniscus lens in said fifth lens group and $r_{5P}$ a radius of curvature of said convex surface opposed to the concave surface of said negative meniscus lens, in said first positive lens in said fifth lens group.

51. The projection optical system according to claim 50, wherein said fifth lens group comprises at least one second positive lens on the side of a convex surface of said negative meniscus lens, and wherein said fifth lens group comprises at least one third positive lens on the opposite side to said negative meniscus lens with respect to said first positive lens disposed adjacent to the concave surface of said negative meniscus lens.

52. The projection optical system according to claim 51, wherein said projection optical system satisfies the following conditions:

$0.1<f_1/f_3<17$ $0.05<f_2/f_4<7$ $0.01<f_5/L<0.9$ $0.02<f_6/L<1.6$ $1.1<f_{2m}/f_2<9$ where $f_1$ is a focal length of said first lens group, $f_2$ a focal length of said second lens group, $f_3$ a focal length of said third lens group, $f_4$ a focal length of said fourth lens group, $f_5$ a focal length of said fifth lens group, $f_6$ a focal length of said sixth lens group, $f_{2m}$ a composite focal length of the intermediate lens group in said second lens group, and L a distance from said first object to said second object.

53. The projection optical system according to claim 52, which satisfies the following condition:

$1.0<I/L$ where I is an axial distance from said first object to a first object side focal point of the whole of said projection optical system and L the distance from said first object to said second object.

54. The projection optical system according to claim 53, wherein said fifth lens group comprises a negative lens disposed nearest to said second object and having a concave surface directed to said second object.

55. The projection optical system according to claim 54, wherein said sixth lens group satisfies the following condition:

$0.50<d_6/r_{6F}<1.50$ where $r_{6F}$ is a radius of curvature of a lens surface nearest to the first object in said sixth lens group and $d_6$ an axial distance from the lens surface nearest to the first object in said sixth lens group to the second object.

56. The projection optical system according to claim 55, wherein said fifth lens group satisfies the following condition:

$0.30<(r_{5F}-r_{5R})/(r_{5F}+r_{5R})<1.28$ where $r_{5F}$ is a radius of curvature of a first-object-side lens surface of said negative lens disposed nearest to said second object in said fifth lens group and $r_{5R}$ a radius of curvature of the second-object-side lens surface of said negative lens disposed nearest to said second object in said fifth lens group.

57. The projection optical system according to claim 56, wherein said second lens group satisfies the following condition:

$$0 \leq f_{2F}/f_{2R} < 18$$

where $f_{2F}$ is a focal length of said front lens in said second lens group and $f_{2R}$ a focal length of said rear lens in said second lens group.

58. The projection optical system according to claim 57, wherein said fifth lens group comprises a first positive meniscus lens disposed nearest to said first object and having a convex surface directed to said second object and a second positive meniscus lens disposed on the side of said second object with respect to said positive meniscus lens and having a convex surface directed to said second object, and wherein said fifth lens group satisfies the following condition:

$$1.2 < Q_{52}/Q_{51} < 8$$

where $Q_{51} = (r_{51F} - r_{51R})/(r_{51F} + r_{51R})$ $Q_{52} = (r_{52F} - r_{52R})/(r_{52F} + r_{52R})$ where $r_{51F}$ is a radius of curvature of a first-object-side lens surface of said first positive meniscus lens, $r_{51R}$ a radius of curvature of the second-object-side lens surface of said first positive meniscus lens, $r_{52F}$ a radius of curvature of a first-object-side lens surface of said second positive meniscus lens, and $r_{52R}$ a radius of curvature of the second-object-side lens surface of said second positive meniscus lens.

59. The projection optical system according to claim 58, wherein said fifth lens group satisfies the following condition:

$$0.01 < Q_{51} < 0.8$$

where $Q_{51} = (r_{51F} - r_{51R})/(r_{51F} + r_{51R})$ where $r_{51F}$ is the radius of curvature of the first-object-side lens surface of said first positive meniscus lens in said fifth lens group and $r_{51R}$ the radius of curvature of the second-object-side lens surface of said first positive meniscus lens in said fifth lens group.

60. The projection optical system according to claim 59, further comprising an aperture stop disposed between said first positive meniscus lens and said second positive meniscus lens.

61. The projection optical system according to claim 60 wherein said sixth lens group comprises three or less lenses and each lens has at least one lens surface satisfying the following condition:

$$1/|\Phi L| < 20$$

where $\Phi$: a refractive power of said lens surface

L: the distance from said first object to said second object.

62. The projection optical system according to claim 61, wherein said first lens group comprises at least two positive lenses, said third lens group comprises at least three positive lenses, said fourth lens group comprises at least three negative lenses, said fifth lens group comprises said at least seven positive lenses and at least one negative lens, and said sixth lens group comprises at least one positive lens.

63. The projection optical system according to claim 62, wherein a magnification of said projection optical system is ¼.

64. The projection optical system according to claim 54, wherein said fifth lens group satisfies the following condition:

$$0.30 < (r_{5F} - r_{5R})/(r_{5F} + r_{5R}) < 1.28$$

where $r_{5F}$ is a radius of curvature of a first-object-side lens surface of said negative lens disposed nearest to said second object in said fifth lens group and $r_{5R}$ a radius of curvature of the second-object-side lens surface of said negative lens disposed nearest to said second object in said fifth lens group.

65. The projection optical system according to claim 54, wherein said fifth lens group comprises a first positive meniscus lens disposed nearest to said first object and having a convex surface directed to said second object and a second positive meniscus lens disposed on the side of said second object with respect to said positive meniscus lens and having a convex surface directed to said second object, and wherein said fifth lens group satisfies the following condition:

$$1.2 < Q_{52}/Q_{51} < 8$$

where $Q_{51} = (r_{51F} - r_{51R})/(r_{51F} + r_{51R})$ $Q_{52} = (r_{52F} - r_{52R})/(r_{52F} + r_{52R})$ where $r_{51F}$ is a radius of curvature of a first-object-side lens surface of said first positive meniscus lens, $r_{51R}$ a radius of curvature of the second-object-side lens surface of said first positive meniscus lens, $r_{52F}$ a radius of curvature of a first-object-side lens surface of said second positive meniscus lens, and $r_{52R}$ a radius of curvature of the second-object-side lens surface of said second positive meniscus lens.

66. The projection optical system according to claim 65, wherein said fifth lens group satisfies the following condition:

$$0.01 < Q_{51} < 0.8$$

where $Q_{51} = (r_{51F} - r_{51R})/(r_{51F} + r_{51R})$ where $r_{51F}$ the radius of curvature of the first-object-side lens surface of said first positive meniscus lens in said fifth lens group and $r_{51P}$ the radius of curvature of the second-object-side lens surface of said first positive meniscus lens in said fifth lens group.

67. The projection optical system according to claim 65, further comprising an aperture stop disposed between said first positive meniscus lens and said second positive meniscus lens.

68. The projection optical system according to claim 54, wherein said second lens group satisfies the following condition:

$$0 \leq f_{2F}/f_{2R} < 18$$

where $f_{2F}$ is a focal length of said front lens in said second lens group and $f_{2R}$ a focal length of said rear lens in said second lens group.

69. The projection optical system according to claim 54, wherein said sixth lens group comprises three or less lenses and each lens has at least one lens surface satisfying the following condition:

$$1/|\Phi L| < 20$$

where Φ: a refractive power of said lens surface

L: the distance from said first object to said second object.

70. A method for fabricating at least semiconductor devices or liquid crystal display devices, comprising the steps of:

preparing a projection optical system for projecting an image of a first object onto a second object, said projection optical system comprising:

a first lens group disposed between said first object and said second object and having a positive refractive power;

a second lens group disposed between said first lens group and said second object and not including a positive lens, wherein said second lens group comprises, a front lens disposed nearest to said first object, having a concave surface directed to said second object, and having a negative refractive power, a rear lens disposed nearest to said second object, having a concave surface directed to said first object, and having a negative refractive power, and an intermediate lens group disposed between said front lens in the second lens group and said rear lens in the second lens group and having at least two negative lenses;

a third lens group disposed between said second lens group and said second object and having a positive refractive power;

a fourth lens group disposed between said third lens group and said second object and having a negative refractive power;

a fifth lens group disposed between said fourth lens group and said second object and having a positive refractive power; and a sixth lens group disposed between said fifth lens group and said second object and having a positive refractive power, wherein said fourth lens group comprises a biconcave lens, a first negative lens disposed on said first object side of said biconcave lens and having a concave surface directed to said second object, and a second negative lens disposed on said second object side of said biconcave lens and having a concave surface directed to said first object, and wherein said fifth lens group comprises a negative meniscus lens and a first positive lens disposed adjacent to a concave surface of said negative meniscus lens and having a convex surface opposed to the concave surface of said negative meniscus lens;

illuminating a mask prepared as said first object with light having a predetermined wavelength, said mask being formed a predetermined pattern thereon; and projecting an image of the pattern on said mask onto a photosensitive substrate prepared as said second object through said projection optical system, thereby performing an exposure process.

71. The method according to claim 70, wherein in said exposure process, said mask and said substrate move with respect to said projection optical system, while projecting the image of the pattern on said mask onto said substrate through said projection optical system.

72. A method for fabricating at least semiconductor devices or liquid crystal display devices, comprising the steps of:

preparing a projection optical system for protecting an image of a first object onto a second object, said projection optical system comprising:

a first lens group disposed between said first object and said second object and having a positive refractive power;

a second lens group disposed between said first lens group and said second object and not including a positive lens, wherein said second lens group comprises, a front lens disposed nearest to said first object, having a concave surface directed to said second object, and having a negative refractive power, a rear lens disposed nearest to said second object, having a concave surface directed to said first object, and having a negative refractive power, and an intermediate lens group disposed between said front lens in the second lens group and said rear lens in the second lens group and having at least two negative lenses;

a third lens group disposed between said second lens group and said second object and having a positive refractive power;

a fourth lens group disposed between said third lens group and said second object and having a negative refractive power;

a fifth lens group disposed between said fourth lens group and said second object and having a positive refractive power; and a sixth lens group disposed between said fifth lens group and said second object and having a positive refractive power, wherein said fourth lens group comprises a biconcave lens, a first negative lens disposed on said first object side of said biconcave lens and having a concave surface directed to said second object, and a second negative lens disposed on said second object side of said biconcave lens and having a concave surface directed to said first object, and wherein said fifth lens group comprises a negative meniscus lens and a first positive lens disposed adjacent to a concave surface of said negative meniscus lens and having a convex surface opposed to the concave surface of said negative meniscus lens, wherein said fifth lens group satisfies the following condition:

$$0<(r_{5p}-r_{5n})/(r_{5p}+r_{5n})<1$$

where $r_{5n}$ is a radius of curvature of said concave surface of said negative meniscus lens in said fifth lens group and $r_{5p}$ a radius of curvature of said convex surface opposed to the concave surface of said negative meniscus lens, in said first positive lens in said fifth lens group, wherein said fifth lens group comprises at least one second positive lens on the side of a convex surface of said negative meniscus lens, wherein said fifth lens group comprises at least one third positive lens on the opposite side to said negative meniscus lens with respect to said first positive lens disposed adjacent to the concave surface of said negative meniscus lens, wherein said projection optical system satisfies the following conditions:

$$0.1<f_1/f_3<17$$

$$0.05<f_2/f_4<7$$

$$0.01 < f_5/L < 0.9$$
$$0.02 < f_6/L < 1.6$$
$$1.1 < f_{2m}/f_2 < 9$$

where $f_1$ is a focal length of said first lens group, $f_2$ a focal length of said second lens group, $f_3$ a focal length of said third lens group, $f_4$ a focal length of said fourth lens group, $f_5$ a focal length of said fifth lens group, $f_{2m}$ a focal length of said sixth lens group, $f_2$ a composite focal length of the intermediate lens group in said second lens group, and L a distance from said first object to said second object, wherein said projection optical system satisfies the following condition;

$$1.0 < I/L$$

where I is an axial distance from said first object to a first object side focal point of the whole of said projection optical system and L the distance from said first object to said second object, wherein said fifth lens group comprises a negative lens disposed nearest to said second object and having a concave surface directed to said second object, wherein said sixth lens group satisfies the following condition:

$$0.50 < d_6/r_{6F} < 1.50$$

where $r_{6F}$ is a radius of curvature of a lens surface nearest to the first object in said sixth lens group and $d_6$ an axial distance from the lens surface nearest to the first object in said sixth lens group to the second object, and wherein said fifth lens group satisfies the following condition:

$$0.30 < (r_{5F} - r_{5R})/(r_{5F} + r_{5R}) < 1.28$$

where $r_{5F}$ is a radius of curvature of a first-object-side lens surface of said negative lens disposed nearest to said second object an said fifth lens group and $r_{5R}$ a radius of curvature of the second-object-side lens surface of said negative lens disposed nearest to said second object in said fifth lens group illuminating a mask prepared as said first object with light having a predetermined wavelength, said mask being formed a predetermined pattern thereon; and projecting an image of the pattern on said mask onto a photosensitive substrate prepared as said second object through said projection optical system, thereby performing an exposure process.

73. The method according to claim 72, wherein in said exposure process, said mask and said substrate move with respect to said projection optical system, while projecting the image of the pattern on said mask onto said substrate through said projection optical system.

74. A projection optical system for projecting an image of a first object onto a second object, comprising:

a first lens group disposed between said first object and said second object and having a positive refractive power;

a second lens group disposed between said first lens group and said second object and not including a positive lens, wherein said second lens group comprises, a front lens disposed nearest to said first object, having a concave surface directed to said second object, and having a negative refractive power, a rear lens disposed nearest to said second object, having a concave surface directed to said first object, and having a negative refractive power, and an intermediate lens group disposed between said front lens in said second lens group and said rear lens in said second lens group and having at least two negative lenses;

a third lens group disposed between said second lens group and said second object and having a positive refractive power;

a fourth lens group disposed between said third lens group and said second object and having a negative refractive power;

a fifth lens group disposed between said fourth lens group and said second object and having a positive refractive power; and a sixth lens group disposed between said fifth lens group and said second object and having a positive refractive power;

wherein said fourth lens group comprises a biconcave lens, a first negative lens disposed on said first object side of said biconcave lens and having a concave surface directed to said second object, and a second negative lens disposed on said second object side of said biconcave lens and having a concave surface directed to said first object, wherein said fifth lens group comprises a negative lens disposed nearest to said second object and having a concave surface directed to said second object, and wherein said fifth lens group satisfies the following condition:

$$0.30 < (r_{5F} - r_{5R})/(r_{5F} + r_{5R}) < 1.28$$

where $r_{5F}$ is a radius of curvature of a first-object-side lens surface of said negative lens disposed nearest to said second object in said fifth lens group and $r_{5R}$ a radius of curvature of—the second-object-side lens surface of said negative lens disposed nearest to said second object in said fifth lens group.

75. The projection optical system according to claim 74, wherein said projection optical system satisfies the following conditions:

$$0.1 < f_1/f_3 < 17$$
$$0.05 < f_2/f_4 < 7$$
$$0.01 < f_5/L < 0.9$$
$$0.02 < f_6/L < 1.6$$
$$1.1 < f_{2m}/f_2 < 9$$

where $f_1$ is a focal length of said first lens group, $f_2$ a focal length of said second lens group, $f_3$ a focal length of said third lens group, $f_4$ a focal length of said fourth lens group, $f_5$ a focal length of said fifth lens group, $f_6$ a focal length of said sixth lens group, $f_{2m}$ a composite focal length of the intermediate lens group in said second lens group, and L a distance from said first object to said second object.

76. The projection optical system according to claim 75, which satisfies the following condition:

$$1.0 < I/L$$

where I is an axial distance from said first object to a first object side focal point of the whole of said projection optical system and L the distance from said first object to said second object.

77. The projection optical system according to claim 76, wherein said sixth lens group satisfies the following condition:

$$0.50 < d_6/r_{6F} < 1.50$$

where $r_{6F}$ is a radius of curvature of a lens surface nearest to the first object in said sixth lens group and $d_6$ an axial distance from the lens surface nearest to the first object in said sixth lens group to the second object.

78. A method for fabricating at least semiconductor devices or liquid crystal display devices, comprising the steps of:

preparing a projection optical system for projecting an image of a first object onto a second object, said projection optical system comprising:

a first lens group disposed between said first object and said second object and having a positive refractive power;

a second lens group disposed between said first lens group and said second object and not including a positive lens, wherein said second lens group comprises, a front lens disposed nearest to said first object, having a concave surface directed to said second object, and having a negative refractive power, a rear lens disposed nearest to said second object, having a concave surface directed to said first object, and having a negative refractive power, and an intermediate lens group disposed between said front lens in said second lens group and said rear lens in said second lens group and having at least two negative lenses;

a third lens group disposed between said second lens group and said second object and having a positive refractive power;

a fourth lens group disposed between said third lens group and said second object and having a negative refractive power;

a fifth lens group disposed between said fourth lens group and said second object and having a positive refractive power; and a sixth lens group disposed between said fifth lens group and said second object and having a positive refractive power;

wherein said fourth lens group comprises a biconcave lens, a first negative lens disposed on said first object side of said biconcave lens and having a concave surface directed to said second object, and a second negative lens disposed on said second object side of said biconcave lens and having a concave surface directed to said first object, wherein said fifth lens group comprises a negative lens disposed nearest to said second object and having a concave surface directed to said second object, and wherein said fifth lens group satisfies the following condition:

$$0.30 < (r_{5F} - r_{5R})/(r_{5F} + r_{5R}) < 1.28$$

where $r_{5F}$ is a radius of curvature of a first-object-side-lens surface of said negative lens disposed nearest to said second object in said fifth lens group and $r_{5R}$ a radius of curvature of the second-object-side lens surface of said negative lens disposed nearest to said second object in said fifth lens group illuminating a mask prepared as said first object with light having a predetermined wavelength, said mask being formed a predetermined pattern thereon; and projecting an image of the pattern on said mask onto a photosensitive substrate prepared as said second object through said projection optical system, thereby performing an exposure process.

79. The method according to claim 78, wherein in said exposure process, said mask and said substrate move with respect to said projection optical system, while projecting the image of the pattern on said mask onto said substrate through said projection optical system.

* * * * *